United States Patent
Matsumura et al.

(10) Patent No.: US 10,852,659 B2
(45) Date of Patent: Dec. 1, 2020

(54) METHOD OF PRODUCING FOIL FORMED MEMBER, METHOD OF PRODUCING WIRING SUBSTRATE, AND METHOD OF PRODUCING INTEGRATED CIRCUIT

(71) Applicant: FUJI XEROX CO., LTD., Tokyo (JP)

(72) Inventors: Yasuo Matsumura, Kanagawa (JP); Sumiaki Yamasaki, Kanagawa (JP); Satoshi Hiraoka, Kanagawa (JP); Shiori Chonan, Kanagawa (JP); Takashi Imai, Kanagawa (JP)

(73) Assignee: FUJI XEROX CO., LTD., Tokyo (JP)

( * ) Notice: Subject to any disclaimer, the term of this patent is extended or adjusted under 35 U.S.C. 154(b) by 0 days.

(21) Appl. No.: 16/118,935

(22) Filed: Aug. 31, 2018

(65) Prior Publication Data
US 2019/0286010 A1    Sep. 19, 2019

(30) Foreign Application Priority Data

Mar. 19, 2018  (JP) .................................. 2018-051714
Mar. 19, 2018  (JP) .................................. 2018-051715

(51) Int. Cl.
| | |
|---|---|
| *H05K 3/30* | (2006.01) |
| *G03G 15/08* | (2006.01) |
| *H05K 3/12* | (2006.01) |
| *H01L 21/48* | (2006.01) |
| *G03G 15/00* | (2006.01) |

(52) U.S. Cl.
CPC .......... *G03G 15/08* (2013.01); *G03G 15/6585* (2013.01); *G03G 15/6591* (2013.01); *H01L 21/4853* (2013.01); *H01L 21/4867* (2013.01); *H05K 3/1266* (2013.01); *H05K 3/303* (2013.01); *H05K 2203/0517* (2013.01)

(58) Field of Classification Search
CPC .............. G03G 15/08; G03G 15/6585; G03G 15/6591; H05K 3/1266; H05K 3/303; H01L 21/4846; H01L 21/4853; H01L 21/4867; H01L 23/498
See application file for complete search history.

(56) References Cited

U.S. PATENT DOCUMENTS

| | | | | |
|---|---|---|---|---|
| 4,923,848 A | * | 5/1990 | Akada .................. | B41M 5/0256 156/235 |
| 6,764,800 B2 | * | 7/2004 | Yamazaki .......... | G03G 5/08214 399/159 |

(Continued)

FOREIGN PATENT DOCUMENTS

| | | |
|---|---|---|
| JP | 2002-059694 A | 2/2002 |
| JP | 2004-095648 A | 3/2004 |

(Continued)

*Primary Examiner* — Paul D Kim
(74) *Attorney, Agent, or Firm* — Sughrue Mion, PLLC

(57) ABSTRACT

A method of producing a foil formed member, includes: preparing a formed member on which a plastic toner image having plasticity is formed; and pressing foil against the formed member at a temperature of 70° C. or lower to form a foil image on the plastic toner image of the formed member, and a method of producing a wiring substrate, includes: preparing a substrate on which a toner image of a toner, in which a volume fraction of particles having a particle diameter of 16 μm or more is less than 1%, is formed; and forming a foil image on the toner image of the substrate.

17 Claims, 7 Drawing Sheets

(56) References Cited

U.S. PATENT DOCUMENTS

| | | | | |
|---|---|---|---|---|
| 8,652,742 B2 * | 2/2014 | Matsushima | ...... | G03G 15/1605 |
| | | | | 156/701 |
| 2006/0073312 A1 * | 4/2006 | Hattori | .................. | B32B 27/36 |
| | | | | 428/195.1 |
| 2011/0017834 A1 * | 1/2011 | Schulze-Hagenest | ....................... | |
| | | | | G03G 7/0093 |
| | | | | 235/492 |
| 2012/0251174 A1 | 10/2012 | Shirai et al. | | |
| 2013/0000836 A1 | 1/2013 | Matsumoto et al. | | |

FOREIGN PATENT DOCUMENTS

| JP | 4368441 B2 | 11/2009 |
|---|---|---|
| JP | 2011-238837 A | 11/2011 |
| JP | 2013-015953 A | 1/2013 |
| JP | 5906791 B2 | 4/2016 |

* cited by examiner

METHOD OF PRODUCING FOIL FORMED MEMBER, METHOD OF PRODUCING WIRING SUBSTRATE, AND METHOD OF PRODUCING INTEGRATED CIRCUIT

CROSS-REFERENCE TO RELATED APPLICATIONS

This application is based on and claims priority under 35 USC 119 from Japanese Patent Application No. 2018-051714 filed Mar. 19, 2018, and Japanese Patent Application No. 2018-051715 filed Mar. 19, 2018.

BACKGROUND

(i) Technical Field

The present invention relates to a method of producing a foil formed member, a method of producing a wiring substrate, and a method of producing an integrated circuit.

(ii) Related Art

Japanese Patent No. 5906791 discloses that transfer foil is transported and layered on an image support, where a toner image portion for foil bonding is formed, in a contact manner, heated by a foil transfer roller in this state, and naturally cooled after passing through a nip portion of the foil transfer roller, to bond the foil onto the toner image portion for foil bonding.

JP-A-2002-59694 discloses that a foil set on a foil unwinding shaft synchronously with a printing and coating speed of a ultraviolet curable pressure-sensitive adhesive layer (hereinafter, referred to as UV pressure-sensitive adhesive), is overlapped on a base material, where the UV pressure-sensitive adhesive layer is printed and coated, and pressurized by a pressurization roll, and the foil on a portion of the UV pressure-sensitive adhesive layer is cut and peeled from the support and moved to the base material.

Japanese Patent No. 4368441 discloses that foil is loaded on a member, where a surface to be coated with foil is formed, and pressurized by a foil pressing plate while heating the foil on the surface to be coated with foil.

JP-A-2013-15953 discloses that transported transfer foil is layered on a recording base material, where a resin layer for foil bonding is formed, in a state of being contacted with a surface of the resin layer for foil bonding, heated by a foil transfer roller in this state, and naturally cooled after passing through a nip portion of the foil transfer roller, to bond the conductive foil to the resin layer for foil bonding.

JP-A-2011-238837 discloses that a transfer member is pressurized against an electrostatic latent image support at linear pressure of 250 gf/cm to transfer a copper power pattern, this transfer member is heated to 150° C. for 60 minutes after the transfer, to harden the pressure-sensitive adhesive layer and obtain the insoluble and infusible adhesive layer having heat resistance, and a printed circuit board including an electric circuit is produced by this operation.

JP-A-2004-95648 discloses that a conductive circuit formation pattern is formed on a peeling surface of a peeling sheet with a toner by a well-known electrographic method to produce a peeling sheet, where the conductive circuit formation pattern is formed.

SUMMARY

In the case of forming foil on a formed member, a foil image may be formed on a toner image which is formed on the formed member.

Here, for example, the foil image may be formed on the toner image on the formed member by heating, but in this case, the formed member and the toner image formed on the formed member may be affected by the heating, and product quality of the foil formed member, where the foil image is formed, may be deteriorated.

Aspects of non-limiting embodiments of the present disclosure relate to a method producing a foil formed member (first aspect), which prevents a deterioration of the product quality of a foil formed member, as compared with the case where foil is pressed and pressurized against a formed member at a temperature higher than 70° C. to form the foil image on a toner image of the formed member.

In the case of producing a wiring substrate by forming the foil image on a substrate, the foil image may be formed on a toner image which is formed on the substrate. Here, a deterioration of the product quality of the wiring substrate, such as occurrence of a shirt circuit between a part and the other part of the wiring formed by the foil image on a toner image, may occur, depending on a size of particles included in a toner of the toner image formed on the substrate.

Aspects of non-limiting embodiments of the present disclosure relate to a method producing a wiring substrate or an integrated circuit (second aspect), which prevents a deterioration of the product quality of the wiring substrate, as compared with the case of forming a foil image on a toner image of a toner in which a volume fraction of particles having a particle diameter of 16 μm or more is 1% or more.

Aspects of certain non-limiting embodiments of the present disclosure overcome the above disadvantages and other disadvantages not described above. However, aspects of the non-limiting embodiments are not required to overcome the disadvantages described above, and aspects of the non-limiting embodiments of the present disclosure may not overcome any of the problems described above.

As a specific method for the first aspect, the following method of producing a foil formed member (Embodiment 1) is included.

According to the first aspect of the present disclosure, there is provided a method of producing a foil formed member, including: preparing a formed member on which a plastic toner image having plasticity is formed by a plastic toner; and pressing foil against the formed member at a temperature of 70° C. or lower to form the foil image on the plastic toner image of the formed member.

As a specific method for the second aspect, the following method of producing a wiring substrate or an integrated circuit (Embodiment 2) is included.

According to the second aspect of the present disclosure, there are provided a method of producing a wiring substrate including: preparing a substrate on which a toner image of a toner, in which a volume fraction of particles having a particle diameter of 16 μm or more is less than 1%, is formed; and forming a foil image on the toner image of the substrate, and a method of producing an integrated circuit using the method of producing a wiring substrate.

BRIEF DESCRIPTION OF THE DRAWINGS

Exemplary embodiments of the present invention will be described in detail based on the following figures, wherein.

DETAILED DESCRIPTION

First, a method of producing a foil formed member according to Embodiment 1 for the first aspect will be described in detail with reference to accompanying drawings.

<Description of Image Forming Apparatus>

Figure 1:
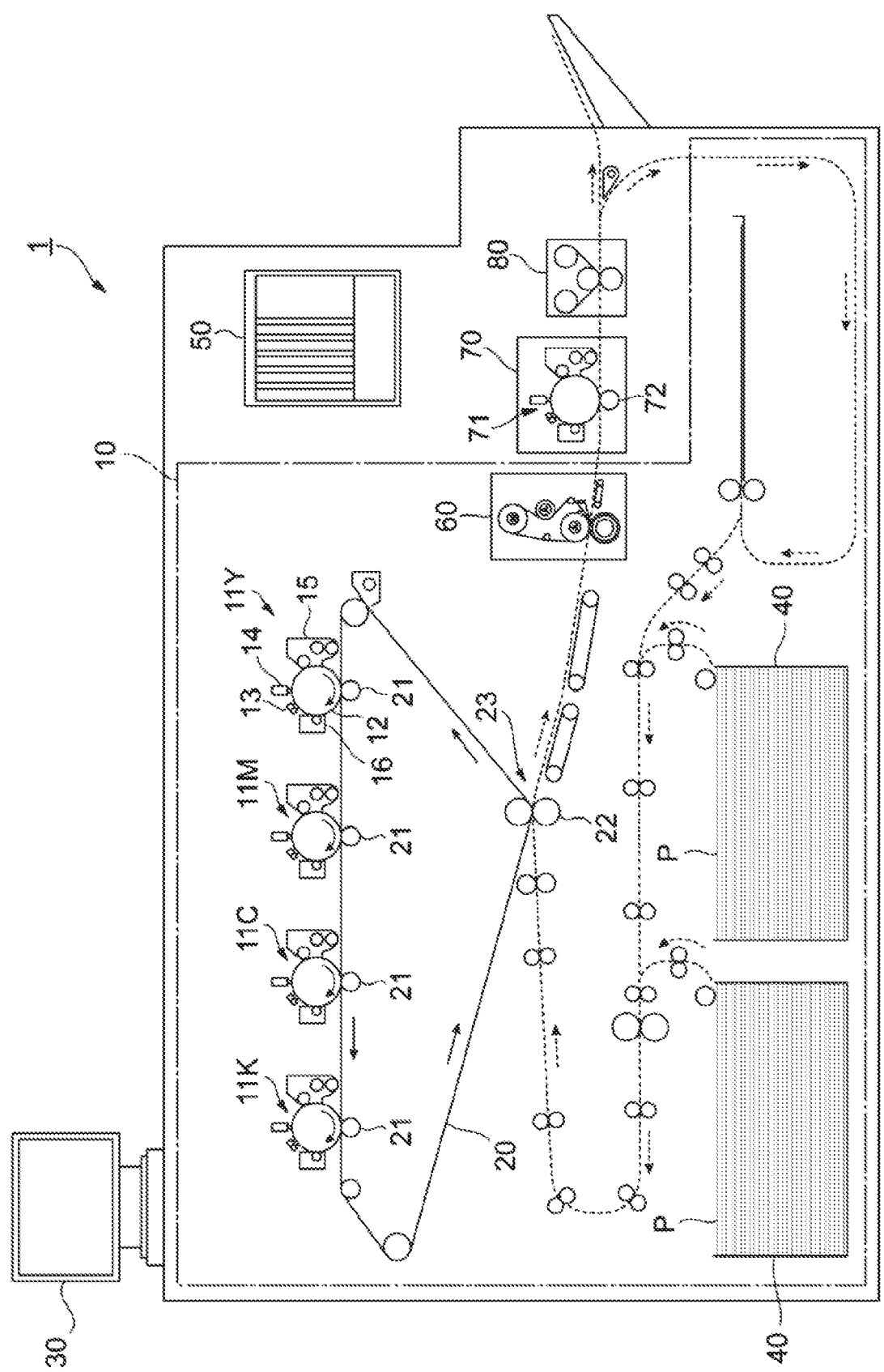
FIG. 1 is a configuration diagram showing an image forming apparatus.

FIG. 1 is a configuration diagram showing an image forming apparatus 1 according to Embodiment 1.

The image forming apparatus 1 shown in FIG. 1 is a so-called tandem type color printer and includes an image formation section 10 which performs image formation on a sheet P as an example of a formed member based on image data, a control unit 50 which executes motion control of the entire image forming apparatus 1 and communication with a personal computer, for example, and image processing performed with respect to image data, and a user interface unit 30 which receives operation input from a user and displays various information items with respect to a user. In addition, the image forming apparatus 1 includes a pressure-sensitive toner image formation section 70 which forms a pressure-sensitive toner image on the sheet P with a pressure-sensitive toner as an example of a plastic toner having plasticity, and a foil formation section 80 which forms a foil image on the pressure-sensitive toner image of the sheet P.

<Description of Image Formation Section>

The image formation section 10 is, for example, a functional unit which forms an image by an electrographic method, and includes four image forming units of a yellow (Y) image forming unit 11Y, a magenta (M) image forming unit 11M, a cyan (C) image forming unit 11C, and a black (K) image forming unit 11K.

In the following description, these image forming units are collectively referred to as an "image forming unit 11", in the case of describing each image forming unit without distinguishing.

Each image forming unit 11, for example, includes a photoreceptor drum 12 on which an electrostatic latent image is formed and each color toner image is formed, a charging member 13 which charges a surface of the photoreceptor drum 12 with a predetermined potential, an exposing device 14 which exposes the photoreceptor drum 12 charged by the charging member 13 based on image data, a developing device 15 which develops the electrostatic latent image formed on the photoreceptor drum 12 with each color toner, and a cleaner 16 which cleans the surface of the photoreceptor drum 12 after transfer. The image forming units 11 substantially has the same configuration, except toners accommodated in the developing device 15.

The image formation section 10 includes a transfer belt 20 which transfers each color toner image formed on the photoreceptor drum 12 of each image forming unit 11, and a primary transfer roll 21 which transfers (primarily transfers) the each color toner image formed by each image forming unit 11 to the transfer belt 20. The image formation section 10 further includes a secondary transfer roll 22 which collectively transfers (secondarily transfers) each color toner image transferred to be superimposed on the transfer belt 20 to the sheet P, and a fixing unit 60 which fixes the color toner image on the sheet P by heating and pressurizing the sheet P, where each color toner image is formed. In Embodiment 1, a toner of a toner image fixed on the sheet P by a heat fixing process of the fixing unit 60 is referred to as a heat fixing toner. The heat fixing toner is heated, and accordingly, the viscosity is lowered.

In Embodiment 1, a region where the secondary transfer roll 22 is disposed and each color heat fixing toner image on the transfer belt 20 is secondarily transferred to the sheet P, is referred to as a secondary transfer region 23.

<Description of Image Forming Operation>

Next, a specific image forming operation of the image forming apparatus 1 according to Embodiment 1 will be described.

Each of the image forming units 11 of the image formation section 10 forms each of yellow, magenta, cyan, and black heat fixing toner image using the fixing member by an electrographic process. Each color heat fixing toner image formed by each image forming unit 11 is primarily transferred onto the transfer belt 20 in the order by the primary transfer roll 21, and a full-color toner image where each color heat fixing toner is superimposed is formed. The full-color toner image on the transfer belt 20 is transported to the secondary transfer region 23 where the secondary transfer roll 22 is disposed in accordance with movement (arrow direction) of the transfer belt 20.

In a recording medium transportation system, the sheet P pulled out from a recording medium accommodating container 40 by a pull-out roll is transported along a feeding path and arrives the secondary transfer region 23. In the secondary transfer region 23, the full-color toner image held on the transfer belt 20 is collectively secondarily transferred to the sheet P by a transfer electric field formed by the secondary transfer roll 22.

After that, the sheet P, where the image is formed, is separated from the transfer belt 20 and transported to the fixing unit 60 along the feeding path. The image (heat fixing toner image) on the sheet P transported to the fixing unit 60 is fixed to the sheet P by a fixing process performed by the fixing unit 60.

In Embodiment 1, the pressure-sensitive toner image is formed on the sheet P where the heat fixing toner image is formed. Foil is pressed against the sheet P, where the pressure-sensitive toner image is formed, at a temperature of 70° C. or lower, to bond the foil to the pressure-sensitive toner. Accordingly, the foil image is not formed on the heat fixing toner image, but the foil image is formed on the pressure-sensitive toner image on the sheet P.

<Description of Pressure-Sensitive Toner Image Formation Section>

The pressure-sensitive toner image formation section 70, for example, includes a pressure-sensitive toner image forming unit 71 which is a functional unit which forms a pressure-sensitive toner image by an electrographic method. The pressure-sensitive toner image forming unit 71 substantially has the same configuration as that of each image forming unit 11 of the image formation section 10, except that the pressure-sensitive toner is accommodated. The pressure-sensitive toner image formation section 70 includes a pressure-sensitive toner image transfer roll 72 which transfers the pressure-sensitive toner image formed by the pressure-sensitive toner image forming unit 71 to the sheet P.

<Configuration of Pressure-Sensitive Toner>

Next, a configuration of the pressure-sensitive toner will be described.

The pressure-sensitive toner used in Embodiment 1 may be a color toner including a colorant or may be a transparent toner (clear toner), and a transparent toner is preferable. In the case where the transparent toner is used as the pressure-sensitive toner and the foil image is formed on the pressure-sensitive toner image of the sheet P, the showing through of the color of the pressure-sensitive toner image is prevented, in the case where the foil image is seen by a user. In Embodiment 1, a term, transparency means transparency at least with respect to visible light. The transparent toner of Embodiment 1 substantially does not include a colorant. The expression "substantially not including" means the extent that the colored degree is recognized with the naked eyes.

The pressure-sensitive toner includes a binder resin. In addition, the pressure-sensitive toner may include a release agent, may include an internal additive, or may include an external additive.

In the case where the pressure-sensitive toner used in Embodiment 1 is pressurized at a temperature of 70° C. or lower, the viscosity is lowered. That is, in the case where the pressure-sensitive toner of Embodiment 1 is pressurized without heating, the viscosity is lowered.

(Binder Resin)

The binder resin is a resin which binds the pressure-sensitive toner to the sheet P by sticking to the sheet P. In addition, in the case where the binder resin is pressurized to the foil, the binder resin is stuck to this foil, and accordingly, the foil is bonded to the pressure-sensitive toner.

The pressure-sensitive toner used in Embodiment 1 preferably includes two or more kinds of different binder resins having a glass transition temperature (Tg). Hereinafter, among two or more kinds of binder resins, a binder resin having a higher glass transition temperature is referred to as a high Tg resin and a binder resin having a lower glass transition temperature is referred to as a low Tg resin. The high Tg resin is an example of a first resin and the low Tg resin is an example of a second resin.

A temperature difference between the glass transition temperature of the high Tg resin and the glass transition temperature of the low Tg resin is preferably 30° C. or higher and more preferably 35° C. or higher. In the case where the temperature difference between the glass transition temperature of the high Tg resin and the glass transition temperature of the low Tg resin is 30° C. or higher, and the pressurization is performed with respect to the pressure-sensitive toner without heating, the viscosity of this pressure-sensitive toner is easily lowered.

In the case where a total of a content of the high Tg resin and a content of the low Tg resin included in the pressure-sensitive toner is set as 100 parts by weight, the pressure-sensitive toner preferably includes 5 parts by weight to 70 parts by weight, more preferably includes 10 parts by weight to 60 parts by weight, and even more preferably 20 parts by weight to 50 parts by weight of the high Tg resin.

In the case where the pressure-sensitive toner includes 5 parts by weight to 70 parts by weight of the high Tg resin, and the pressurization is performed with respect to the pressure-sensitive toner without heating, the viscosity of this pressure-sensitive toner is easily lowered.

A glass transition temperature of the high Tg resin is preferably 40° C. or higher and lower than 60° C. and more preferably 45° C. or higher and lower than 55° C.

In the case where the glass transition temperature of the high Tg resin is 40° C. or higher, a change in properties of the pressure-sensitive toner or a deformation of the pressure-sensitive toner is prevented, during the storage of the pressure-sensitive toner.

In the case where the glass transition temperature of the high Tg resin is lower than 60° C., and the pressurization is performed with respect to the pressure-sensitive toner without heating, the viscosity of this pressure-sensitive toner is easily lowered.

A glass transition temperature of the low Tg resin is preferably lower than 10° C., more preferably −100° C. or higher and lower than 10° C., and even more preferably −80° C. or higher and lower than 10° C.

In the case where the glass transition temperature of the low Tg resin is lower than 10° C., the viscosity of the pressure-sensitive toner is easily lowered, even in the case where the pressure applied to the pressure-sensitive toner is low.

The high Tg resin and the low Tg resin included in the pressure-sensitive toner used in Embodiment 1 are phase-separated. In this case, the pressure-sensitive toner has baroplastic properties. The baroplastic properties are properties that the viscosity of a toner is easily lowered, in the case where the pressurization is performed with respect to the toner without heating. That is, the baroplastic properties are properties that the toner is easily deformed and flows by the pressurization.

Examples of the configuration in which the high Tg resin and the low Tg resin are phase-separated, include a configuration in which a block copolymer of a high Tg segment and a low Tg segment are formed, and a configuration in which the high Tg resin and the low Tg resin form a core-shell structure. The high Tg segment is a portion included in the high Tg resin of the block copolymer. The low Tg segment is a portion included in the low Tg resin of the block copolymer.

A connecting type of the high Tg segment and the low Tg segment of the block copolymer is not particularly limited. In the case where the high Tg segment is set as A and the low Tg segment is set as B, an AB type, ABA type. BAB type, $(AB)_n$ type, $(AB)_nA$ type, or $B(AB)_n$ type block copolymer is used as the block copolymer.

Examples of the binder resin forming the block copolymer include an additive polymerizable resin and a polycondensed resin.

The pressure-sensitive toner having a core-shell structure preferably includes a core in which the high Tg resin and the low Tg resin are phase-separated, and a shell which covers the core.

The core may include a release agent or may include an internal additive.

Examples of the binder resin forming the core-shell structure include an additive polymerizable resin and a polycondensed resin.

In the case where the high Tg resin and the low Tg resin are phase-separated in a surface portion of the pressure-sensitive toner, the viscosity of the pressure-sensitive toner may be lowered, even in the case where a low pressure is applied to the pressure-sensitive toner. In this case, the pressure-sensitive toners may be aggregated due to an external force affected to the pressure-sensitive toners accommodated in the pressure-sensitive toner image forming unit 71.

On the other hand, in the case where the portion of the pressure-sensitive toner where the high Tg resin and the low Tg resin are phase-separated is coated and a low pressure is applied to the pressure-sensitive toner, a deformation of the pressure-sensitive toner is prevented. In this case, the occurrence or blocking of the aggregated particles between the pressure-sensitive toners during the storage or usage hardly occurs.

In the case where a total of a content of the high Tg resin and a content of the low Tg resin is set as 100 parts by weight, the core of the pressure-sensitive toner preferably includes 50 parts by weight of the high Tg resin and the low Tg resin, respectively.

In the case where the core includes 50 parts by weight of the high Tg resin and the low Tg resin, respectively, and a pressure having a predetermined degree or more (for example, pressure of 1 MPa or more) is applied to the pressure-sensitive toner, the viscosity of the pressure-sensitive toner is easily lowered.

In the case where a total of a content of the high Tg resin and a content of the low Tg resin is set as 100 parts by weight, the shell of the pressure-sensitive toner preferably includes a larger amount of the high Tg resin than that of the low Tg resin, and more preferably includes 100 parts by weight of the high Tg resin and does not include the low Tg resin. In the shell, the expression of a total amount of the content of the high Tg resin which is greater than a total amount of the content of the low Tg resin includes a state where the shell includes the high Tg resin and does not include the low Tg resin.

In the case where the shell includes a larger amount of the high Tg resin than that of the low Tg resin, and a low pressure is applied to the pressure-sensitive toner, the viscosity of the pressure-sensitive toner is hardly lowered. Accordingly, the bonding of the pressure-sensitive toner to the inner portion of the pressure-sensitive toner image forming unit 71 due to an external force affected to the pressure-sensitive toner accommodated in the pressure-sensitive toner image forming unit 71 is prevented. That is, the pressure-sensitive toner becomes strong with respect to pressure stress.

Examples of the binder resin include an additive polymerizable resin and a polycondensed resin.

The additive polymerizable resin is a polymer generated by polymerization of a monomer having an ethylenically unsaturated double bond. Examples of this monomer include styrenes (for example, styrene, parachlorostyrene, or α-methylstyrene), (meth)acrylic acid esters (for example, methyl acrylate, ethyl acrylate, propyl acrylate, butyl acrylate, lauryl acrylate, 2-ethylhexyl acrylate, methyl methacrylate, ethyl methacrylate, propyl methacrylate, butyl methacrylate, hexyl methacrylate, lauryl methacrylate, or 2-ethylhexyl methacrylate), (meth)acrylonitriles (for example, acrylonitrile, or methacrylonitrile), ethylenically unsaturated carboxylic acid (for example, acrylic acid, methacrylic acid, or crotonic acid), vinyl ethers (for example, vinyl methyl ether or vinyl isobutyl ether), vinyl ketones (for example, vinyl methyl ketone, vinyl ethyl ketone, or vinyl isopropenyl ketone), olefins (for example, isoprene, butene, or butadiene), and β-carboxyethyl acrylate. From these monomers, any of a homopolymer generated by polymerization of one kind of the monomer, a copolymer generated by copolymerization of two or more kinds of monomers, and a mixture of these homopolymer and the copolymer may be used as the additive polymerizable resin.

(Meth)acrylic acid and (meth)acrylonitrile include acrylic acid and methacrylic acid.

The additive polymerizable resin includes an acidic polar group, a basic polar group, or an alcoholic hydroxyl group.

Examples of the acidic polar group include a carboxyl group, a sulfonic acid group, and acid anhydride.

Examples of the basic polar group include an amino group, an amide group, and a hydrazide group.

As the monomer including the basic polar group among the monomers included in the additive polymerizable resin, a monomer including a nitrogen atom is used, for example. As the monomer including a nitrogen atom, a (meth)acrylic acid amide compound, a (meth)acrylic acid hydrazide compound, or a (meth)acrylic acid aminoalkyl compound is preferably used.

Examples of the (meth)acrylic acid amide compound include acrylic acid amide, methacrylic acid amide, acrylic acid methylamide, methacrylic acid methylamide, acrylic acid dimethylamide, acrylic acid diethylamide, acrylic acid phenylamide, and acrylic acid benzylamide.

Examples of the (meth)acrylic acid hydrazide compound include acrylic acid hydrazide, methacrylic acid hydrazide, methyl acrylate hydrazide, methacrylic acid methyl hydrazide, acrylic acid dimethyl hydrazide, acrylic acid phenyl hydrazide.

Examples of the (meth)acrylic acid aminoalkyl compound include 2-aminoethyl acrylate, 2-aminoethyl methacrylate, and 2-(diethylamino) ethyl (meth)acrylate. The (meth)acrylic acid aminoalkyl compound may be a (meth)acrylic acid monoalkylaminoalkyl compound or a (meth)acrylic acid dialkylaminoalkyl compound.

As the monomer including the alcoholic hydroxyl group among the monomers included in the additive polymerizable resin, hydroxy (meth)acrylates are preferably used, for example. Examples of the hydroxy (meth)acrylates include 2-hydroxyethyl (meth)acrylate, hydroxypropyl (meth)acrylate, and hydroxybutyl (meth)acrylate.

In the polymerization of the additive polymerizable resin, a chain transfer agent may be used.

The chain transfer agent is not particularly limited and, a compound including a thiol component is used, for example. As the compound including a thiol component, mercaptan is used, for example. Among mercaptan, alkyl mercaptans such as hexyl mercaptan, heptyl mercaptan, octyl mercaptan, nonyl mercaptan, decyl mercaptan, or dodecyl mercaptan are preferable.

The additive polymerizable resin may be a crosslinked resin to which a crosslinking agent is added. As the crosslinking agent, for example, a multifunctional monomer including two or more ethylenically unsaturated groups in a molecule is used.

Examples of the multifunctional monomer include aromatic polyvinyl compounds (for example, divinylbenzene or divinylnaphthalene), polyvinyl esters of aromatic polyvalent carboxylic acid (for example, divinyl phthalate, divinyl isophthalate, divinyl terephthalate, divinyl homophthalate, divinyl/trivinyl trimesate, divinyl naphthalene dicarboxylate, or divinyl biphenyl carboxylate), divinyl esters of nitrogen-containing aromatic compounds (for example, divinyl pyridinedicarboxylate), vinyl esters of unsaturated heterocyclic compound carboxylic acid (for example, vinyl pyromutate, vinyl furancarboxylate, vinyl pyrrole-2-carboxylate, and vinyl thiophenecarboxylate), (meth)acrylic acid esters of linear polyol (for example, vutanediol methacrylate, hexanediol acrylate, octanediol methacrylate, decanediol acrylate, or dodecanediol methacrylate), (meth) acrylic esters of polyol having a branched structure or a substituent (for example, neopentyl glycol dimethacrylate, or 2-hydroxy-1,3-diacryloxypropane), polypropylene polyethylene glycol di(meth)acrylates (for example, polyethylene glycol di(meth)acrylate), and polyvinyl esters of polycarboxylic acid (for example, divinyl succinate, divinyl fumarate, vinyl maleate/divinyl, divinyl diglycolate, vinyl itaconate/divinyl, divinyl acetone dicarboxylate, divinyl glutarate, divinyl 3,3'-thiodipropionate, trans-aconitic acid divinyl/trivinyl, divinyl adipate, divinyl pimelate, divinyl suberate, divinyl azelate, divinyl sebacate, divinyl dodecanedioate, or divinyl brassylate). These crosslinking agent may be used singly or in combination of two or more kinds thereof.

Among the crosslinking agents, (meth)acrylic esters of linear polyol (for example, butanediol methacrylate, hexanediol acrylate, octanediol methacrylate, decanediol acrylate, or dodecanediol methacrylate), (meth)acrylic esters of polyol having a branched structure or a substituent (for example, neopentyl glycol dimethacrylate, or 2-hydroxy-1,3-diacryloxypropane), and polypropylene polyethylene glycol di(meth)acrylate (for example, polyethylene glycol di(meth)acrylate) are preferably used.

A content of the crosslinking agent is preferably 0.05% by weight to 5% by weight and more preferably 0.1% by weight to 1.0% by weight with respect to a total amount of the monomers included in the additive polymerizable resin.

The additive polymerizable resin may be produced by radical polymerization using a radical polymerization initiator. The radical polymerization initiator is not particularly limited and a well-known radical polymerization initiator is used.

The amount of the radical polymerization initiator used is preferably 0.01% by weight to 15% by weight and more preferably 0.1% by weight to 10% by weight with respect to a total amount of the monomers included in the additive polymerizable resin.

A weight average molecular weight of the additive polymerizable resin is preferably 1,500 to 60,000 and more preferably 3,000 to 40,000.

A weight average molecular weight (Mw) and a number average molecular weight (Mn) are measured by gel permeation chromatography (GPC). The molecular weight measurement by GPC is performed by using GPC.HLC-8120 GPC manufactured by Tosoh Corporation as a measuring device, TSKgel Super HM-M (15 cm), and a THF solvent. The weight average molecular weight and the number average molecular weight are calculated by using a molecular weight distribution curve created by a monodisperse polystyrene standard sample from the measurement results.

As the polycondensed resin, a polyester resin is used, for example. This polyester resin may be crystalline or amorphous.

Examples of a monomer included in the polyester resin include polyvalent carboxylic acid in which two or more carboxyl group are included in one molecule, polyol in which two or more hydroxyl groups are included in one molecule, and hydroxycarboxylic acid.

Examples of dicarboxylic acid among polyvalent carboxylic acid included in a crystalline polyester resin include oxalic acid, glutaric acid, succinic acid, maleic acid, adipic acid, β-methyladipic acid, azelaic acid, sebacic acid, nonanedicarboxylic acid, decanedicarboxylic acid, undecane dicarboxylic acid, dodecane dicarboxylic acid, fumaric acid, citraconic acid, diglycolic acid, cyclohexane-3,5-diene-1,2-carboxylic acid, malic acid, citric acid, hexahydroterephthalic acid, malonic acid, pimelic acid, tartaric acid, mucic acid, phthalic acid, isophthalic acid, terephthalic acid, tetrachlorophthalic acid, chlorophthalic acid, nitrophthalic acid, p-carboxyphenylacetic acid, p-phenylene diacetic acid, m-phenylenediglycolic acid, p-phenylenediglycolic acid, o-phenylenediglycolic acid, diphenylacetic acid, diphenyl-p,p'-dicarboxylic acid, naphthalene-1,4-dicarboxylic acid, naphthalene-1,5-dicarboxylic acid, naphthalene-2,6-dicarboxylic acid, anthracenedicarboxylic acid, and 1,4-cyclohexanedicarboxylic acid. These dicarboxylic acids may be used singly or in combination of two or more kinds thereof.

Examples of polyvalent carboxylic acid except the dicarboxylic acid among polyvalent carboxylic acid included in the crystalline polyester resin include trimellitic acid, pyromellitic acid, naphthalene tricarboxylic acid, naphthalene tetracarboxylic acid, pyrene tricarboxylic acid, and pyrene tetracarboxylic acid. In addition, a component which is obtained by allowing a carboxyl group of these carboxylic acids to be induced to acid anhydride, mixed acid anhydride, acid chloride, or ester may be used. These polyvalent carboxylic acid may be used singly or in combination of two or more kinds thereof.

Examples of polyol included in the crystalline polyester resin include ethylene glycol, diethylene glycol, triethylene glycol, 1,2-propylene glycol, 1,3-propylene glycol, 1,4-butanediol, 1,4-butenediol, neopentyl glycol, 1,5-pentane glycol, 1,6-hexane glycol, 1,4-cyclohexane diol, 1,4-cyclohexane dimethanol, dipropylene glycol, polyethylene glycol, polypropylene glycol, polytetramethylene glycol, bisphenol A, bisphenol Z, hydrogenated bisphenol A, cyclohexane dimethanol, and an alkylene oxide adduct of these. These polyols may be used singly or in combination of two or more kinds thereof.

By combining the polyvalent carboxylic acid and the polyol to allow polycondensation, the crystalline polyester resin is obtained.

Examples of the crystalline polyester resin include a polyester resin obtained by polycondensation of 1,9-nonanediol and 1,10-decanedicarboxylic acid, a polyester resin obtained by polycondensation of cyclohexanediol and adipic acid, a polyester resin obtained by polycondensation of 1,6-hexanediol and sebacic acid, a polyester resin obtained by polycondensation of ethylene glycol and succinic acid, a polyester resin obtained by polycondensation of ethylene glycol and sebacic acid, and a polyester resin obtained by polycondensation of 1,4-butanediol and succinic acid.

One kind from each of the polyvalent carboxylic acid and the polyol may be used, one kind from the one and two or more kinds from the other may be used, or two or more kinds from each of the polyvalent carboxylic acid and the polyol may be used. In the case of using hydroxycarboxylic acid as the monomer, hydroxycarboxylic acid may be used singly or in combination of two or more kinds thereof. In addition, the polyvalent carboxylic acid or the polyol and hydroxycarboxylic acid may be used in combination.

Examples of the dicarboxylic acid among the polyvalent carboxylic acid included in an amorphous polyester resin include phthalic acid, isophthalic acid, terephthalic acid, tetrachlorophthalic acid, chlorophthalic acid, nitrophthalic acid, p-carboxyphenylacetic acid, p-phenylene diacetic acid, m-phenylenediglycolic acid, p-phenylenediglycolic acid, o-phenylenediglycolic acid, diphenylacetic acid, diphenyl-p,p'-dicarboxylic acid, naphthalene-1,4-dicarboxylic acid, naphthalene-1,5-dicarboxylic acid, naphthalene-2,6-dicarboxylic acid, anthracenedicarboxylic acid, and cyclohexanedicarboxylic acid.

Examples of the polyvalent carboxylic acid except the dicarboxylic acid among polyvalent carboxylic acid included in the amorphous polyester resin include trimellitic acid, pyromellitic acid, naphthalene tricarboxylic acid, naphthalene tetracarboxylic acid, pyrene tricarboxylic acid, and pyrene tetracarboxylic acid. In addition, a component which is obtained by allowing a carboxyl group of these carboxylic acids to be induced to acid anhydride, acid chloride, or ester may be used. These polyvalent carboxylic acid may be used singly or in combination of two or more kinds thereof.

Among these, terephthalic acid or lower ester thereof, diphenylacetic acid, or 1,4-cyclohexanedicarboxylic acid is preferably used. The lower ester is ester of aliphatic alcohol having 1 to 8 carbon atoms.

Examples of the polyol included in the amorphous polyester resin include the polyol which is the polyol included in the crystalline polyester resin. Among these polyols, particularly, polytetramethylene glycol, bisphenol A, bisphenol Z, hydrogenated bisphenol A, cyclohexane dimethanol, and an alkylene oxide adduct thereof are preferably used. These polyols may be used singly or in combination of two or more kinds thereof.

By combining the polyvalent carboxylic acid and the polyol to allow polycondensation, the amorphous polyester resin is obtained.

By combining the polycondensable monomers to allow polycondensation, an amorphous resin or a crystalline resin is obtained.

In order to produce a polycondensed resin, one kind from each of the polyvalent carboxylic acid and the polyol may be used, one kind from the one and two or more kinds from the other may be used, or two or more kinds from each of the polyvalent carboxylic acid and the polyol may be used. In addition, in the case of producing a polycondensed resin by using hydroxycarboxylic acid, the hydroxycarboxylic acid may be used singly or in combination of two or more kinds thereof. The polyvalent carboxylic acid or the polyol and hydroxycarboxylic acid may be used in combination.

A weight average molecular weight of the polycondensed resin is preferably 1,500 to 60,000 and more preferably 3,000 to 40,000. In addition, the polycondensed resin may have a partially branched or a crosslinked structure in accordance with a valence of carboxylic acid of the monomer or a valence of alcohol.

(Release Agent)

A release agent is not particularly limited, and examples thereof include hydrocarbon wax, natural wax (for example, carnauba wax, rice wax, or candelilla wax), synthesis or mineral/petroleum wax (for example, montan wax), and ester wax (for example, fatty acid ester or montanic acid ester).

A melting temperature of the release agent is preferably 50° C. to 110° C. and more preferably 60° C. to 100° C.

The melting temperature is obtained from a DSC curve obtained by differential scanning calorimetry measurement (DSC) based on "melting peak temperature" described in the method of obtaining a melting temperature in JIS K-7121-1987 "Testing methods for transition temperatures of plastics".

A percentage of the release agent included in the pressure-sensitive toner is preferably 1% by weight to 20% by weight and more preferably 5% by weight to 15% by weight with respect to the weight of the pressure-sensitive toner.

(Internal Additive)

Examples of an internal additive include additives such as a magnetic material, a charge-controlling agent, and an inorganic particle.

(External Additive)

Examples of the external additive include inorganic particles. Examples of the inorganic particles include $SiO_2$, $TiO_2$, $Al_2O_3$, $CuO$, $ZnO$, $SnO_2$, $CeO_2$, $Fe_2O_3$, $MgO$, $BaO$, $CaO$, $K_2O$, $Na_2O$, $ZrO_2$, $CaO.SiO_2$, $K_2O.(TiO_2)_n$, $Al_2O_3.2SiO_2$, $CaCO_3$, $MgCO_3$, $BaSO_4$, and $MgSO_4$.

The surfaces of the inorganic particles used as the external additive are preferably treated with a hydrophobizing agent. The hydrophobizing treatment is performed by, for example, dipping the inorganic particles in a hydrophobizing agent. The hydrophobizing agent is not particularly limited and examples thereof include a silane coupling agent, silicone oil, a titanate coupling agent, and an aluminum coupling agent. These may be used singly or in combination of two or more kinds thereof. The amount of the hydrophobizing agent used is, for example, 1 parts by weight to 10 parts by weight with respect to 100 parts by weight of the inorganic particles.

Examples of the external additive also include resin particles (polystyrene, polymethyl methacrylate (PMMA), and melamine resin) and a cleaning aid (for example, particles of a metal salt of higher fatty acid represented by zinc stearate, and a fluorine polymer member).

A percentage of the external additive included in the pressure-sensitive toner is, for example, preferably 0.01% by weight to 5% by weight and more preferably 0.01% by weight to 2.0% by weight with respect to the weight of the pressure-sensitive toner.

<Properties of Pressure-Sensitive Toner>

In the case where the pressure-sensitive toner used in Embodiment 1 is pressurized at a temperature of 70° C. or lower, the viscosity is lowered.

In the formation of a foil image onto the formed member where a toner image is formed, for example, in the case where foil is pressed against a resin sheet at a temperature higher than 70° C. by using the resin sheet as the formed member to bond this foil to a toner image on the resin sheet, the resin sheet may be affected and deformed due to the heat.

In addition, in the case where foil is pressed against a formed member, where a heat fixing toner image is formed as an image, which is different from the toner image used for bonding the foil to the formed member, at a temperature higher than 70° C., the viscosity of the heat fixing toner image may be lowered, and the foil may be also bonded to this heat fixing toner image. That is, in the case of forming a foil image on a toner image of the formed member by pressing the foil against the formed member at a temperature higher than 70° C., product quality of the foil formed member where the foil image is formed may be deteriorated.

With respect to this, in the case where the pressure-sensitive toner is configured so that the viscosity of the pressure-sensitive toner is lowered due to the pressurization at a temperature of 70° C. or lower, and the foil is pressed against the formed member where the pressure-sensitive toner image is formed, without heating, the foil is bonded to the pressure-sensitive toner and the foil image is formed on the pressure-sensitive toner image on the sheet P.

In this case, the deformation of the formed member is prevented due to a small calorie applied to the formed member. In addition, even in the case where the heat fixing toner image is formed on the formed member, the viscosity of the heat fixing toner image is hardly lowered, and thus, the bonding of the foil to the heat fixing toner image is prevented. That is, a deterioration of product quality of the foil formed member is prevented.

The pressure-sensitive toner of Embodiment 1 satisfies Expression (1).

$$20° C. \leq T(1\ MPa) - T(10\ MPa) \qquad \text{[Expression 1]}$$

In Expression (1), T (1 MPa) represents a temperature at which a viscosity of the pressure-sensitive toner becomes $10^4$ Pa·s when a pressure of 1 MPa is applied to the pressure-sensitive toner and, and T (10 MPa) represents a temperature at which a viscosity of the pressure-sensitive toner becomes $10^4$ Pa·s when a pressure of 10 MPa is applied to the pressure-sensitive toner.

In Embodiment 1, pressure applied to the pressure-sensitive toner is measure by using a flow tester.

In the case where the pressure-sensitive toner does not satisfy Expression (1), and the pressure-sensitive toner is pressurized at a low temperature, although the pressure applied to the pressure-sensitive toner increases from 1 MPa to 10 MPa, the viscosity of the pressure-sensitive toner is hardly lowered. That is, the pressure dependence of the viscosity in the pressure-sensitive toner is low. That is, in the case where the pressure-sensitive toner is pressurized by the pressure in the range described above at a temperature of 70° C. or lower, the viscosity of the pressure-sensitive toner is hardly lowered.

With respect to this, in the case where the pressure-sensitive toner satisfies Expression (1) and the pressure-sensitive toner is pressurized at a low temperature according to an increase of the pressure applied to the pressure-sensitive toner in the range described above, the viscosity of the pressure-sensitive toner is easily lowered. That is, the pressure dependence of the viscosity in the pressure-sensitive toner is high and has baroplastic properties of the pressure-sensitive toner becomes significant. That is, in the case where the pressure-sensitive toner is pressurized by the pressure in the range described above at a temperature of 70° C. or lower, the viscosity of the pressure-sensitive toner is easily lowered. Therefore, in the case where foil is pressed against the formed member where the pressure-sensitive toner image is formed, without heating, the foil is easily bonded to the pressure-sensitive toner.

A temperature difference between a temperature at which the viscosity of the pressure-sensitive toner becomes $10^4$ Pa·s under an applied pressure of 1 MPa. and a temperature at which the viscosity of the pressure-sensitive toner becomes $10^4$ Pa·s under an applied pressure of 10 MPa is preferably 20° C. to 120° C., more preferably 25° C. to 80° C., and even more preferably 30° C. to 60° C.

In the case where the temperature difference is 120° C. or lower and a low pressure is applied to the pressure-sensitive toner, the viscosity of the pressure-sensitive toner is prevented from lowering. Accordingly, the sticking of the pressure-sensitive toner accommodated in the pressure-sensitive toner image forming unit 71 to the inner portion of the pressure-sensitive toner image forming unit 71 or aggregation of particles thereof due to an effect of an external force is prevented. That is, the pressure-sensitive toner is strengthened against the pressure stress.

A cumulative volume average particle diameter (D50v) of the pressure-sensitive toner is preferably 2 µm to 10 µm and more preferably 4 µm to 8 µm.

In the measurement of the cumulative volume average particle diameter and a particle diameter distribution index of the toner particles, COULTER MULTISIZER II (manufactured by Beckman Coulter, Inc.) is used, and in the measurement regarding an electrolyte, ISOTON-II (manufactured by Beckman Coulter. Inc.) is used.

In the measurement, a material obtained by adding 0.5 mg to 50 mg of a measurement sample to a dispersing agent formed of 2 ml of a 5% aqueous solution of surfactant is added to 100 ml to 150 ml of the electrolyte. As the surfactant, sodium alkyl benzene sulfonate is preferably used.

Then, the electrolyte in which the sample is suspended is subjected to a dispersion treatment using an ultrasonic disperser for 1 minute, and a particle diameter distribution of particles having a particle diameter of 2 µm to 60 µm is measured by COULTER MULTISIZER II using an aperture having an aperture diameter of 100 µm, 50,000 particles are sampled.

Cumulative distributions are drawn from the side of the smallest diameter with respect to particle diameter ranges (channels) separated based on the measured particle size distribution. The particle diameter in the case where the cumulative percentage becomes 16% is defined as that corresponding to a volume particle diameter D16v and a number particle diameter D16p, while the particle diameter in the case where the cumulative percentage becomes 50% is defined as that corresponding to a cumulative volume average particle diameter D50v and a cumulative number average particle diameter D50p. Furthermore, the particle diameter in the case where the cumulative percentage becomes 84% is defined as that corresponding to a volume particle diameter D84v and a number particle diameter D84p. In this case, the volume average particle diameter distribution index (GSDv) and the number average particle diameter distribution index (GSDp) are respectively obtained by the following expressions.

$$GSDv = \left(\frac{D84v}{D16v}\right)^{0.5} \quad \text{[Expression 2]}$$

$$GSDp = \frac{D84p^{0.5}}{D16p} \quad \text{[Expression 3]}$$

A shape factor SF1 of the pressure-sensitive toner is preferably 110 to 150 and more preferably 120 to 140.

The shape factor SF1 is obtained by the following expression.

$$SF1 = \left(\frac{ML^2}{A}\right) \times \left(\frac{\pi}{4}\right) \times 100 \quad \text{[Expression 4]}$$

In Expression (4), ML represents an absolute maximum length of a toner and A represents a projected area of a toner. The absolute maximum length is a maximum length of a distance between any two points on an outline of a particle. The projected area is an area of a projected image on the plane of the particle.

The shape factor SF1 is numerically converted mainly by analyzing a microscopic image or a scanning electron microscopic (SEM) image by using an image analyzer. Specifically, an optical microscopic image of particles scattered on a surface of a glass slide is input to an image analyzer LUZEX through a video camera to obtain absolute maximum lengths and projected areas of 100 particles. The absolute maximum length and the projected area of each particle are put into Expression (4) to calculate the shape factor SF1 of each particle, and an average value of the calculated values is obtained as the shape factor SF1 of the pressure-sensitive toner.

<Producing Method of Pressure-Sensitive Toner>

Next, a producing method of the pressure-sensitive toner will be described.

A producing method of the pressure-sensitive toner used in Embodiment 1 is not particularly limited and examples thereof include a kneading and pulverizing method, an emulsion aggregating method, a dissolution and suspension method, and a suspension polymerization method. Among these, the emulsion aggregating method and dissolution and suspension method are preferable.

[Emulsion Aggregating Method]

The emulsion aggregating method will be described.

The emulsion aggregating method includes an emulsification step of emulsifying a raw material of a pressure-sensitive toner to form resin particles (emulsified particles), an aggregating step of forming aggregates of the formed resin particles, and a coalescence step of coalescing the aggregates.

(Emulsification Step)

First, a resin particle dispersion is produced by applying a shear force to a solution obtained by mixing an aqueous medium and a binder resin with each other by a dispersing device. At this time, the viscosity of the resin component may be lowered by heating to form particles. For stabilization of the dispersed resin particles, a dispersing agent may be used.

In the case where the resin is oily and is dissolved in a solvent having a comparatively low solubility to water, the resin is dissolved in these solvents to perform particle dispersion with a dispersing agent or a polymer electrolyte in water, transpiration of the solvent is caused by heating or reducing the pressure, and accordingly, a resin particle dispersion is produced.

Examples of the aqueous medium include water (for example, distilled water and ion exchange water) and alcohols. Among these, water is preferably used.

Examples of the dispersing agent include a water-soluble polymer (for example, polyvinyl alcohol, methyl cellulose, ethyl cellulose, hydroxyethyl cellulose, carboxymethyl cellulose, sodium polyacrylate, and sodium polymethacrylate), an anionic surfactant (for example, sodium dodecylbenzenesulfonate, sodium octadecylsulfate, sodium oleate, sodium laurate, and potassium stearate), a cationic surfactant (for example, laurylamine acetate, stearyl amine acetate, and lauryl trimethyl ammonium chloride), a zwitterionic surfactant (for example, lauryl dimethyl amine oxide), a nonionic surfactant (for example, polyoxyethylene alkyl ether, polyoxyethylene alkyl phenyl ether, and polyoxyethylene alkylamine), and inorganic salt (for example, tricalcium phosphate, aluminum hydroxide, calcium sulfate, calcium carbonate, and barium carbonate).

Examples of the dispersing device include a homogenizer, a homomixer, a pressure kneader, an extruder, and a media dispersing device.

A volume average particle diameter of the resin particles is preferably 1.0 µm or less, more preferably 60 nm to 300 nm, and even more preferably 150 nm to 250 nm. In the case where the volume average particle diameter of the resin particles is less than 60 nm, the resin particles are stabilized in the dispersion, and accordingly, the aggregation of the resin particles may be difficult. In the case where the volume average particle diameter of the resin particles exceeds 1.0 µm, the aggregating properties of the resin particles are improved, and it is easy to produce the pressure-sensitive toner, but the particle diameter distribution of the pressure-sensitive toner may be spread.

In addition, a release agent is dispersed in water with the polymer electrolyte such as an ionic surfactant, polymer acid, or polymer base, heated to a temperature which is equal to or higher than a melting temperature of the release agent, and subjected to a dispersion treatment using a homogenizer or a pressure discharging dispersing device to which a strong shear force is applied, and accordingly, a release agent dispersion is produced. The volume average particle diameter of the release agent particles included in this release agent dispersion is preferably 1 µm or less and more preferably 100 nm to 500 nm.

In the case where the volume average particle diameter of the release agent particles is 100 nm or more, the release agent component easily flows into the pressure-sensitive toner. In addition, in the case where the volume average particle diameter of the release agent particles is 500 nm or less, a dispersion state of the release agent in the pressure-sensitive toner becomes excellent.

At the time of the dispersion treatment, an inorganic compound such as polyaluminum chloride may be added to the dispersion. As the inorganic compound, polyaluminum chloride (PAC), aluminum sulfate, highly basic polyaluminum chloride (BAC), polyaluminum hydroxide, and aluminum chloride are preferable. Among these, polyaluminum chloride and aluminum sulfate are more preferable. The release agent dispersion is used in the emulsion aggregating method, but may be used in the case of producing a toner by the suspension polymerization method.

(Aggregating Step)

In the aggregating step, a dispersion of resin particles, the release agent dispersion, and the like are mixed to prepare a mixed solution, and heated at a temperature equal to or lower than a glass transition temperature of the resin particles to aggregate the resin particles, thereby forming aggregated particles. In the case of forming the aggregated particles, an aggregating agent may be used. The formation of the aggregated particles is performed, for example, by adjusting the pH of the mixed solution to acidic under stirring. The pH is preferably 2 to 7.

As the aggregating agent, a surfactant having a polarity opposite to the polarity of the surfactant used as the dispersing agent, inorganic metal salt, and a divalent or higher-valent metal complex are preferable, and a divalent or higher-valent metal complex is more preferable among these. In the case of using a divalent or higher-valent metal complex, the amount of the surfactant used is reduced, and charging properties are improved.

Examples of the inorganic metal salt include aluminum salt and a polymer thereof are preferable. The valence of the inorganic metal salt used is more preferably divalent than monovalent, trivalent than divalent, or tetravalent than trivalent, because the particle diameter distribution of the aggregated particles to be formed are easily narrowed. In addition, in the case of using a polymer of the inorganic metal salt, the particle diameter distribution of the aggregated particles to be formed are easily narrowed, as compared with the case of using a monomer of the inorganic metal salt. In order to narrow the particle diameter distribution of the aggregated particles, a polymer of tetravalent inorganic metal salt including aluminum is preferably used, for example.

In addition, by adding a dispersion in which the resin particles and the surfactant and the like are dispersed, to a solution including the aggregated particles, a shell including the resin particles may be formed on the surface of the aggregated particle as a core (coating step). In the case of adding the dispersion, an aggregating agent may be added or the pH may be adjusted.

(Coalescence Step)

In the coalescence step, the progression of the aggregation is stopped by setting the pH of a suspension of the aggregated particles to be 3 to 9, and the aggregated particles are coalesced by heating at a temperature equal to or higher than a glass transition temperature of the resin particles. In the case where the surface of the aggregated particle is coated with the resin particle in the coating step, the resin particle is also coalesced and a core aggregated particle is coated. The heating time of the coalescence step may be to the extent that the aggregated particles are coalesced, and is specifically approximately 0.5 hours to 10 hours.

The aggregated particles are coalesced and cooled, thereby obtaining coalesced particles. In addition, in the cooling step, the crystallization may be promoted by decreasing a cooling rate at around a glass transition temperature of the resin particles (glass transition temperature of the resin particles ±10° C.), which is so-called slow cooling.

The coalesced particles are subjected to a solid-liquid separation such as filtration (solid-liquid separation step), washed (washing step), and dried (drying step), and thus pressure-sensitive toner particles are obtained.

As the drying step, a method using a flash drying device is used, and specifically, a drying process performed using a flash jet dryer or a process using a fluid bed is used. In the case of performing the drying process by using a flash jet dryer, an airflow temperature (port airflow temperature) is preferably set to be 30° C. to 70° C. and more preferably set to be 40° C. to 60° C.

In addition, an external additive such as a plasticizer or an assist may be added to the obtained pressure-sensitive toner particles (external adding step).

As the external adding step, a process of adding the external additive to the pressure-sensitive toner particles by using a V-blender, HENSCHEL MIXER, a LÖDIGE MIXER, or the like. By this process, the external additives may be added to the pressure-sensitive toner particles in a stepwise manner.

[Dissolution and Suspension Method]

Next, the dissolution and suspension method will be described.

The dissolution and suspension method includes an oil phase preparation step of preparing an oil phase by dissolving or dispersing a toner component including the binder resin in an organic solvent, a granulation step of suspending and granulating an oil phase component in a water phase, and a solvent removal step of removing a solvent.

(Oil Phase Adjustment Step)

First, at least a toner component including the binder resin is dissolved or dispersed in an organic solvent, to prepare an oil phase.

Examples of the organic solvent include hydrocarbon (for example, toluene, xylene, or hexane), halogenated hydrocarbon (for example, methylene chloride, chloroform and dichloroethane), alcohol (for example, ethanol, butanol, benzyl alcohol ether, or tetrahydrofuran), ester (for example, ether, methyl acetate, ethyl acetate, butyl acetate, or isopropyl acetate), and ketones (for example, acetone, methyl ethyl ketone, diisobutyl ketone, cyclohexanone, or methylcyclohexane). It is necessary that these solvents cause the dissolving of the binder resin, but the additive included in the organic solvent separately from the binder resin may not be dissolved. A weight ratio of the toner component including the binder resin used in the oil phase, and the solvent is preferably 10:90 to 80:20, in a viewpoint of ease of granulation or a final toner yield.

(Granulation Step)

The oil phase component is suspended and granulated in the water phase. As the water phase, water is used. In addition, an inorganic particle dispersing agent obtained by mixing inorganic particles and a dispersing agent may be included in the water phase.

The dispersing agent (dispersion stabilizer) has a function of stabilizing dispersion of oil phase droplets by forming a hydrophilic colloid. Examples of the inorganic particle dispersing agent include calcium carbonate, magnesium carbonate, barium carbonate, tricalcium phosphate, hydroxyapatite, diatomaceous earth, and clay.

A particle diameter of the inorganic particle dispersing agent is preferably 1 μm to 2 μm and more preferably 0.1 μm or lower. In addition, the inorganic particle dispersing agent is preferably used after performing crushing to obtain a particle diameter by a ball mill, a sand mill, or a wet dispersing device such as an attritor. In the case where the particle diameter of the inorganic particle dispersing agent is 2 μm or lower, the particle diameter distribution of the granulated toner becomes narrow.

The inorganic particle dispersing agent may be used singly or may be used in combination with an organic particle dispersing agent.

Examples of the organic particle dispersing agent include proteins (for example, gelatin, gelatin derivative (for example, acetylated gelatin, phthalated gelatin, or succinated gelatin), albumin, or casein), collodion, gum arabic, agar, alginic acid, a cellulose derivative (for example, alkyl esters of carboxymethyl cellulose, hydroxymethyl cellulose, or carboxymethyl cellulose), and a synthetic polymer (for example, polyvinyl alcohol, polyvinyl pyrrolidone, polyacrylamide, polyacrylate, polymethacrylate, polymaleate, or polystyrene sulfonate). These organic particle dispersing agent may be used singly or by mixing two or more kinds thereof.

A percentage of the inorganic particle dispersing agent and/or the organic particle dispersing agent included in the water phase is preferably 0.001% by weight to 5% by weight with respect to a main medium of the water phase.

In addition, a dispersion auxiliary agent may be included in the water phase. As the dispersion auxiliary agent, a surfactant is preferable. As the surfactant, for example, an anionic surfactant or a nonionic surfactant is used. These dispersion auxiliary agent may be used singly or by mixing two or more kinds thereof.

A percentage of the dispersion auxiliary agent included in the water phase is preferably 0.001% by weight to 5% by weight with respect to the main medium of the water phase.

A weight ratio of the oil phase to the water phase is preferably 10:90 to 90:10. The granulation of the oil phase in the water phase is preferably performed by using a dispersing device including a high-speed shear mechanism. Examples of the dispersing device including a high-speed shear mechanism include various high-speed blade rotation type or force interval passing type emulsion dispersing device such as a homomixer, a homogenizer, a colloid mill, ULTRATURRAX, Clairmill.

(Solvent Removal Step)

The organic solvent is removed during the granulation step or after the granulation step. The removal of the organic solvent may be performed at room temperature (for example, 25° C.), but is preferably performed at a temperature lower than a boiling point of the organic solvent and lower than a glass transition temperature of the binder resin included in the organic solvent. In the case where the organic solvent is removed at a temperature higher than the glass transition temperature of the binder resin, union of the toner may occur. The removal of the organic solvent is preferably performed by stirring at approximately 40° C. for 3 hours to 24 hours. In addition, the removal of the organic solvent may be performed under the reduced pressure. In the case of performing the removal of the organic solvent under the reduced pressure, the removal thereof is preferably performed under the pressure of 20 mmHg to 150 mmHg.

After removing the solvent, by washing the toner using acids for causing the inorganic dispersing agent to be water-soluble, the inorganic particle dispersing agent remaining on the surface of the toner is removed. Examples of acids include hydrochloric acid, nitric acid, formic acid, and acetic acid. In addition, the toner may be washed again by using alkali water such as sodium hydroxide. Accordingly, an insoluble ionic material on the surface of the toner is dissolved to remove under an acid atmosphere, and accordingly, charging properties or fluidity of the toner is improved. By performing these washing, the wax attached to the surface of the toner is also removed. In the washing a stirring device or an ultrasonic dispersing device is preferably used. In addition, filtering, decantation, or centrifugal separation may be performed with respect to the washed toner.

By drying the washed toner, the pressure-sensitive toner particles are obtained. As the drying, a method using a flash drying device is used, for example. As the method using a flash drying device, a drying process performed using a flash jet dryer or a process using a fluid bed is used. In the case of performing the drying process by using a flash jet dryer, an airflow temperature is preferably set to be 30° C. to 70° C. and more preferably set to be 40° C. to 60° C., as described above.

<Description of Foil>

Next, the foil will be described.

Figure 2:
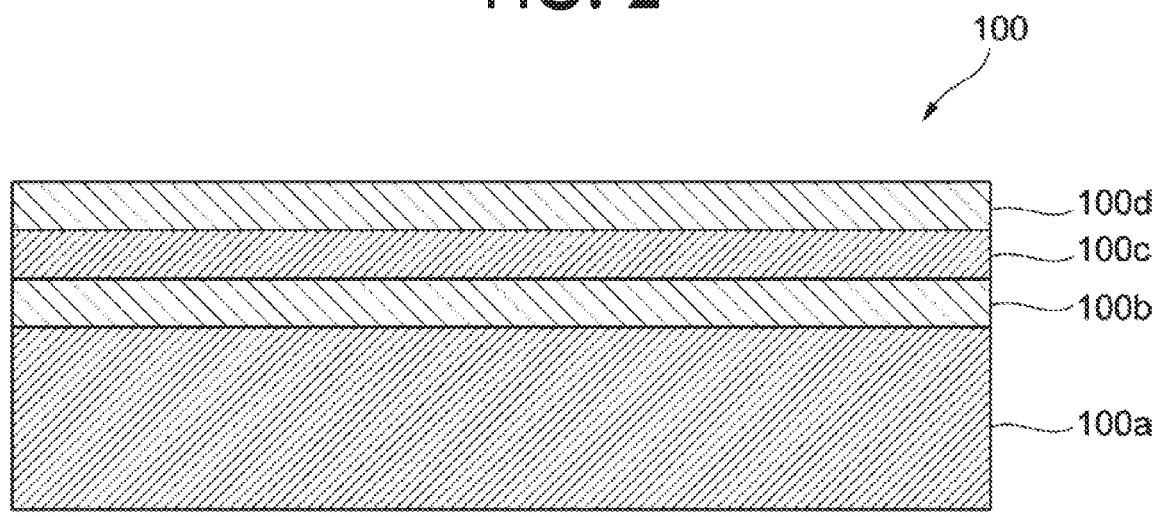
FIG. 2 is a diagram showing a configuration of foil of Embodiment 1.

FIG. 2 is a diagram showing a configuration of foil 100 used in Embodiment 1.

The foil 100 is formed in a film shape and includes a base material 100a, a release layer 100b, a foil layer 100c, and an adhesive layer 100d.

In the foil 100, the base material 100a, the release layer 100b, the foil layer 100c, and the adhesive layer 100d are layered in this order from the lower side of the drawing.

The base material 100a is a support of the release layer 100b, the foil layer 100c, and the adhesive layer 100d. As the base material 100a, a resin sheet or a resin film is used, for example. Examples of the resin include polyethylene terephthalate (PET), polyethylene naphthalate (PEN), polypropylene (PP), polyethersulfone, and polyimide. The base material 100a may have a single layer structure or a multi-layer structure.

The release layer 100b is a layer having a function of ensuring peeling properties of the foil layer 100c and the adhesive layer 100d from the base material 100a As a material used in the release layer 100b, a material obtained by adding wax to a thermosetting resin, an ultraviolet curable resin, or an electron beam curable resin is used. As the thermosetting resin, for example, a resin using melamine or isocyanate as a curing agent, is used. As the ultraviolet curable resin and the electron beam curable resin, a resin including acrylate or an epoxy resin is used. Examples of wax include a fluorine monomer, a silicon monomer, a fluorine polymer, and a silicon polymer. The material used in the release layer 100b may be used singly or in combination of two or more kinds thereof.

The foil layer 100c includes a colored layer including a colorant or a metal layer including a metal material.

As the colored layer, for example, a material obtained by adding a colorant to a resin material is used. Examples of the resin material include an acryl resin, a styrene resin, and a melamine resin. As the colorant, a pigment or a dye is used. In addition, as the colored layer, a hologram layer formed of holograms.

The metal layer is, for example, formed by a vapor deposition method using a metal material, a sputtering method, or an ion plating method. Examples of the metal material include aluminum, tin, silver, chromium nickel, gold, nickel-chromium-iron alloy, bronze, and aluminum-made copper.

The adhesive layer 100d is a layer having a function of exhibiting adhesiveness between the sheet P and the foil layer 100c. As the adhesive layer 100d, an adhesive is used, for example. Examples of the adhesive include an ionomer resin, an acid-modified polyolefin resin, an ethylene-(meth) acrylic acid copolymer, an ethylene-(meth)acrylic acid ester copolymer, a polyester resin, a polyamide resin, vinyl resin, a (meth)acrylic resin, an acrylate ester resin, a maleic acid resin, a butyral type resin, an alkyd resin, a polyethylene oxide resin, a phenol type resin, a urea resin, a melamine resin, a melamine alkyd resin, a cellulose resin, a polyurethane resin, a polyvinyl ether resin, a silicone resin, and a rubber resin. These adhesives may be used singly or in combination of two or more kinds thereof. The configuration of the foil 100 is not limited to the configuration described above.

For example, a configuration in which the adhesive layer 100d is not included in the foil 100 may be used. Even in the case where the foil 100 is pressed against the sheet P, where the pressure-sensitive toner image is formed, by using the foil 100 not including the adhesive layer 100d, the viscosity of the pressure-sensitive toner is lowered, and therefore, the pressure-sensitive toner is bonded to the foil layer 100c, so that the foil image is formed on the pressure-sensitive toner image of the sheet P.

<Description of Foil Formation Section>

Next, the foil formation section 80 will be described.

Figure 3:
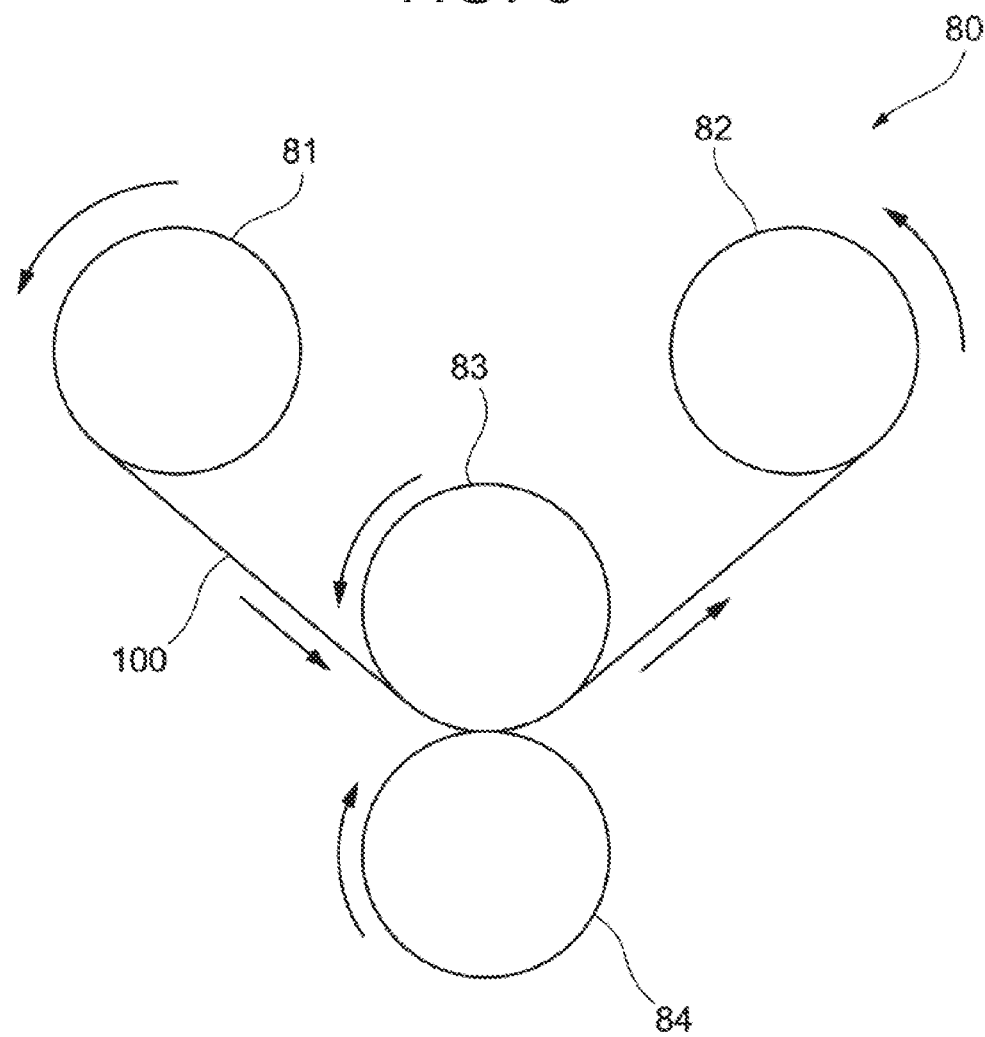
FIG. 3 is a configuration diagram of a foil formation section.

FIG. 3 is a configuration diagram of the foil formation section 80.

The foil formation section 80 holds the integrally formed long foil 100. The foil 100 is pressed against the sheet P. A length of the long foil 100 in a width direction (depth direction of the drawing) may be longer than a length of the sheet P in a width direction.

The foil formation section 80 includes a supply roll 81 which winds the foil 100 in a roll shape and supplies this foil 100 and a winding roll 82 which winds the foil 100 in a roll shape. In addition, the foil formation section 80 includes a foil transfer roll 83 which stretches the foil 100 and transfers the foil 100 to the sheet P, and an opposing roll 84 which opposes the foil transfer roll 83 through the foil 100.

The foil transfer roll 83 is provided between the supply roll 81 and the winding roll 82 and is provided on a side close to the base material 100a rather than the adhesive layer 100d of the foil 100 (see FIG. 2). The foil transfer roll 83 and the opposing roll 84 are pressed against each other.

The foil transfer roll 83 receives a rotation driving force from a driving motor (not shown) and rotates counterclockwise of the drawing. The foil 100 is pressed against the sheet P between the foil transfer roll and the opposing roll 84. At this time, the foil transfer roll 83 may press the foil 100 with respect to a region larger than the length of the sheet P in the width direction.

<Method of Producing Foil Formed Member>

Next, the method of producing the foil formed member will be described.

Figure 4:
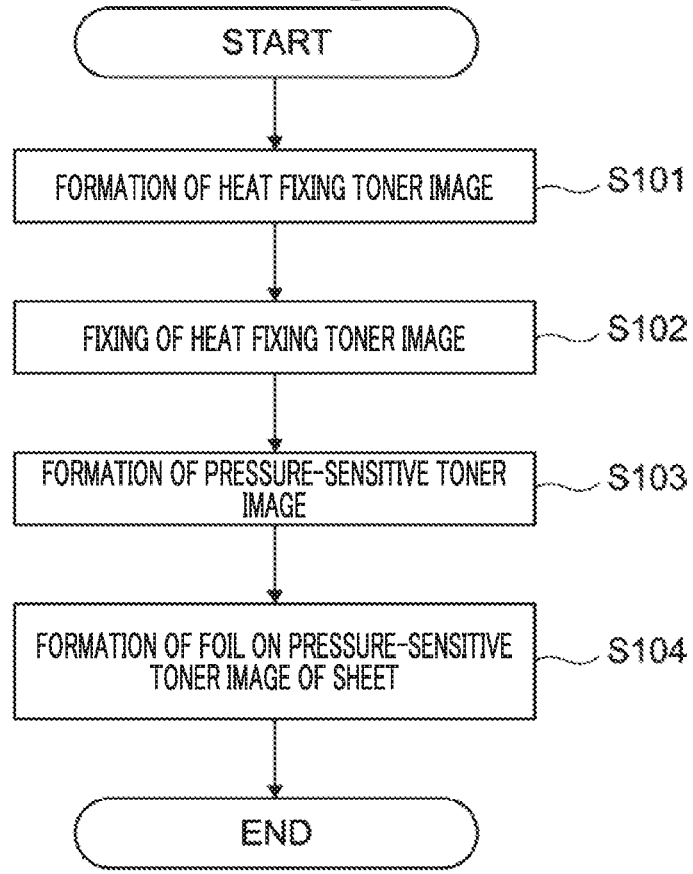
FIG. 4 is a flowchart explaining a method of producing a foil formed member or a wiring substrate.

FIG. 4 is a flowchart explaining the method of producing the foil formed member.

First, the image formation section 10 of the image forming apparatus 1 (see FIG. 1) forms a heat fixing toner image on the sheet P in the secondary transfer region 23 (step (hereinafter, referred to as S) 101: heat fixing toner image forming step). Next, the fixing unit 60 performs the heat fixing process with respect to the sheet P where the heat fixing toner image is formed, to fix the heat fixing toner image on the sheet P (S102: heat fixing step). The formation and the fixing of the heat fixing toner image may be omitted, if necessary. In addition, a formed member where the heat fixing toner is formed in advance may be used.

Then, the sheet P is transported to the pressure-sensitive toner image formation section 70 along a feeding path. The pressure-sensitive toner image formation section 70 forms a pressure-sensitive toner image on the sheet P (S103: pressure-sensitive toner image forming step). The pressure-sensitive toner image forming step also functions as a preparation step of preparing a formed member where a pressure-sensitive toner image is formed.

A pressing roll which presses the transported sheet P may be provided between the pressure-sensitive toner image formation section 70 and the foil formation section 80. The sheet P where the foil image is not formed yet is pressurized by using this pressing roll, the viscosity of the pressure-sensitive toner of the pressure-sensitive toner image formed on the sheet P is lowered to bond the pressure-sensitive toner to the sheet P, and accordingly, the pressure-sensitive toner image may be fixed to the sheet P (preprocessing step).

The sheet P where the pressure-sensitive toner image is formed is transported to the foil formation section 80. In the case where the sheet P gets in between the foil transfer roll 83 (see FIG. 3) and the opposing roll 84, the foil transfer roll 83 presses the foil 100 against the sheet P at a temperature of 70° C. or lower. The viscosity of the pressure-sensitive toner of the pressure-sensitive toner image formed on the sheet P is lowered due to the pressing of the foil 100, and the toner is fixed to the adhesive layer 100*d* of the foil 100 (see FIG. 2). The foil layer 100*c* and the adhesive layer 100*d* of the foil 100 where the pressure-sensitive toner image is superimposed, are peeled off from the base material 100*a*. Accordingly, the foil image (foil layer 100*c* and the adhesive layer 100*d* of the foil 100) is formed on the pressure-sensitive toner image of the sheet P (S104: foil formation step).

By peeling off the foil layer 100*c* and the adhesive layer 100*d* of the foil 100 held by the foil formation section 80, the remaining base material 100*a* and a portion of the foil 100 which is not formed on the sheet P are wound by the winding roll 82.

Through the steps described above, a foil formed member is obtained. In the foil formation step, since the foil image is formed on the sheet P without heating the sheet P, the viscosity of the heat fixing toner of the heat fixing toner image formed on the sheet P is hardly lowered, and the foil is hardly bonded to the heat fixing toner. Accordingly, on the sheet P, the foil is not formed on the heat fixing toner image and the foil image is formed on the pressure-sensitive toner image.

In Embodiment 1, in the foil formation step, by pressing and pressurizing an integrally formed film-shaped foil 100 against the sheet P, the foil image is formed on the pressure-sensitive toner image of the sheet P.

In this case, as compared with the case of forming plural foil images which are separately formed on the sheet P, the generation of a portion where the foil is not formed on the pressure-sensitive toner image of the sheet P is prevented.

Modification Example

In Embodiment 1, the foil formation section 80 (see FIG. 3) forms the foil image on the pressure-sensitive toner image of the sheet P by pressing the integrally formed foil 100 against the sheet P, but a configuration necessary for forming the foil image on the sheet P is not limited to the example described above.

Figure 5:
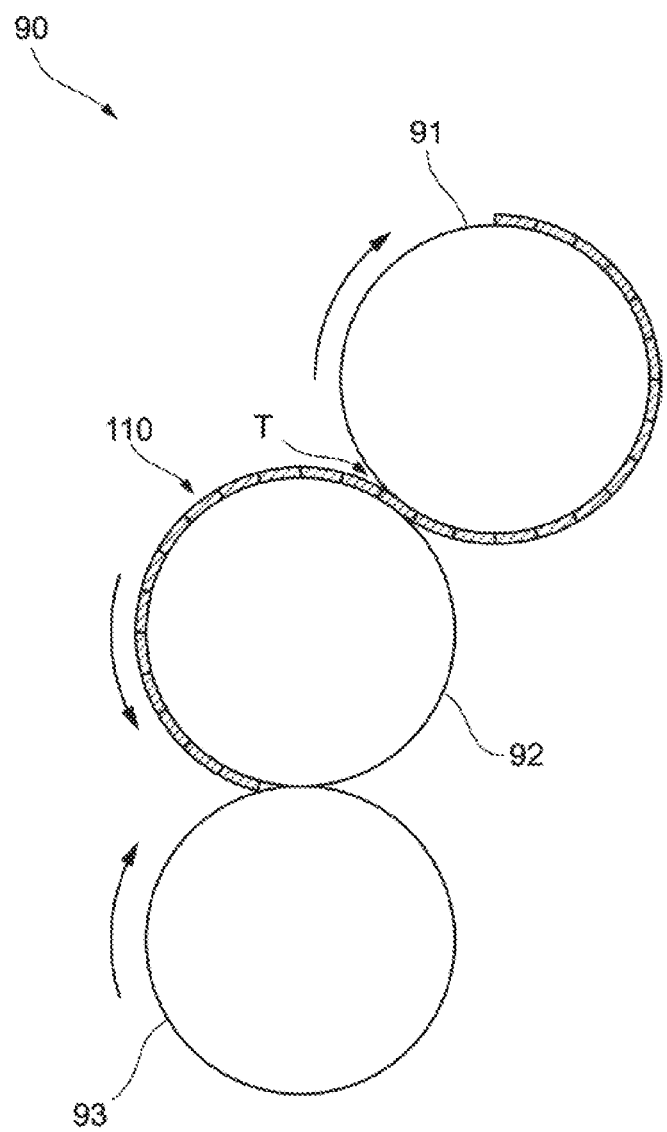
FIG. 5 is a diagram showing a foil formation section as a modification example.

FIG. 5 is a diagram showing a foil formation section 90 as a modification example.

In this modification example, the foil formation section 90 uses plural powdery foils 110 on the sheet P to produce a foil formed member.

A metal powder is included in the foils 110 shown in FIG. 5. Examples of the metal powder include gold powder, silver powder, aluminum powder, tin powder, chromium powder, nickel powder, and bronze powder.

The foil formation section 90 includes a holding roll 91 as a foil holding unit which holds the foils 110, a foil transfer roll 92 which transfers the foils 110 to the sheet P, and an opposing roll 93 which opposes the foil transfer roll 92.

A surface of the holding roll 91 has adsorbing properties. Examples of a material having adsorbing properties include silicon rubber, urethane rubber, fluorine rubber, natural rubber, styrene butadiene rubber, and nitrile rubber. As the holding roll 91, a silicon roll or a urethane roll may be used.

The holding roll 91 rotates while holding the plural foils 110. Specifically, the holding roll 91 rotates clockwise of the drawing, while adsorbing and holding the foils 110 supplied from a cartridge (not shown) accommodating the plural foils 110 on the surface. A length of a region of the holding roll 91 where the foils 110 are adsorbed in a width direction (depth direction of the drawing) may be longer than a length of the sheet P in a width direction.

The surface of the foil transfer roll 92 has adsorbing properties. Examples of a material having adsorbing properties include silicon rubber, urethane rubber, fluorine rubber, natural rubber, styrene butadiene rubber, and nitrile rubber. As the foil transfer roll 92, a silicon roll or a urethane roll may be used.

The adsorption power of the surface of the foil transfer roll 92 is greater than the adsorption power of the surface of the holding roll 91.

The foil transfer roll 92 rotates in counterclockwise of the drawing. The foil transfer roll 92 and the holding roll 91 press each other, and the holding roll 91 supplies the foil 110 to the foil transfer roll 92 through a pressing portion T. A length of the region of the foil transfer roll 92, to which the foil 110 is supplied, in a width direction (depth direction of the drawing) may be longer than a length of the sheet P in a width direction.

Also, in the modification example, after the pressure-sensitive toner image is formed on the sheet P, the foil image is formed on the pressure-sensitive toner image of the sheet P.

The sheet P is transported to the foil formation section 90, after the pressure-sensitive toner image is formed by the pressure-sensitive toner image forming unit 71 (see FIG. 1). In the case where the sheet P gets in between the foil transfer roll 92 and the opposing roll 93, the foil transfer roll 92 presses the plural powdery foils 110 against the sheet P at a temperature of 70° C. or lower. Accordingly, the foils 110 overlapped on the pressure-sensitive toner image, among the plural foils 110 pressed against the sheet P by the foil transfer roll 92, are bonded to the pressure-sensitive toner of the pressure-sensitive toner image, and the foil images are formed on the pressure-sensitive toner image of the sheet P. The foils 110, among the plural foils 110 pressed against the sheet P by the foil transfer roll 92, which are not transferred onto the sheet P are still held by the foil transfer roll 92 thereafter.

The foil transfer roll 92 may press the foils 110 with respect to a region wider than the length of the sheet P in the width direction.

In the configuration in which the plural powdery foils 110 are transferred onto the sheet by using the foil formation section 90 of the modification example, the amount of foils used for forming the next foil image, among the foils which are not transferred onto the sheet P, increases, as compared with the configuration where the integrally formed foil image is formed on the sheet P by using the foil formation section 80 shown in FIG. 2.

For example, in the case of forming the integrally formed foil image on the sheet P, as the configuration shown in FIG. 2, a portion of the foil 100 held by the foil formation section 80, where the foil layer 100c and the adhesive layer 100d do not remain, is not used in the next foil formation. In addition, a peripheral portion of the portion where the foil layer 100c and the adhesive layer 100d do not remain (portion where the foil layer 100c and the adhesive layer 100d remain) is not used in the next foil formation, either.

With respect to this, in the case of forming the plural foils 110 which are separated, on the sheet P, as the configuration shown in the modification example, the foils 110, among the foils 110 held by the foil transfer roll 92, which are not transferred onto the sheet P are continued to be held by the foil transfer roll 92 and are used in the next foil image formation. In this case, the amount of the foils 110 used in the next foil image formation increases.

In Embodiment 1, the example in which the sheet P is used as the formed member has been described, but the formed member is not particularly limited, as long as the foil image may be formed thereon. For example, a resin sheet or a resin film may be used as the formed member.

In Embodiment 1, the pressure-sensitive toner image formation section 70 and the foil formation section 80 are provided in the image forming apparatus 1, but there is no limitation.

For example, separately from the image forming apparatus 1, a configuration of a foil forming apparatus including a pressure-sensitive toner image formation section and a foil formation section may be used. In this case, first, a heat fixing toner image is formed on a formed member using the image forming apparatus. Then, the formed member on which the heat fixing toner image is formed is taken out from the image forming apparatus, and a pressure-sensitive toner image is formed on this formed member by using the pressure-sensitive toner image formation section. The foil is pressed against the formed member on which the pressure-sensitive toner image is formed, by using the foil formation section, and the foil image may be formed on the pressure-sensitive toner image of the formed member.

In addition, the pressure-sensitive toner image formation section and the foil formation section may be provided in separate apparatuses. Further, the pressure-sensitive toner image may be formed without forming the heat fixing toner image on the formed member, and the foil image may be formed on this pressure-sensitive toner image.

Next, a method of producing a wiring substrate or an integrated circuit according to Embodiment 2 for the second aspect will be described in detail.

Regarding the image forming apparatus, the image forming apparatus 1 shown in FIG. 1 described in Embodiment 1 may also be applied to Embodiment 2.

<Configuration of Pressure-Sensitive Toner>

Next, a configuration of the pressure-sensitive toner used in Embodiment 2 will be described.

In Embodiment 2, a pressure-sensitive toner in which a particle diameter is 16 μm or more and a volume fraction of pressure-sensitive toner particles is less than 1% is used. Here, the particle diameter means a volume average particle diameter. In addition, the volume fraction of the pressure-sensitive toner particles having a particle diameter of 16 μm or more means a percentage of a total volume of pressure-sensitive toner particles having a particle diameter of 16 μm or more, with respect to a total volume of the pressure-sensitive toner particles configuring the pressure-sensitive toner.

In the wiring substrate, plural linear wirings may be provided in parallel at narrow interval (for example, interval of 1 mm). Meanwhile, in the case where a linear pressure-sensitive toner image is formed on a substrate by using the pressure-sensitive toner having a great percentage of particles having a large particle diameter, a variation in size of the width of the pressure-sensitive toner image may occur. In the case where a variation in size of the width of the pressure-sensitive toner image occurs, a variation also occurs in size of the width of the foil formed as the wiring on the pressure-sensitive toner image with respect to the substrate. In such a case, in the case where the wiring substrate in which plural wirings are provided in parallel at narrow intervals is produced, by forming each foil on the plural linear pressure-sensitive toner image of the substrate, a variation in interval of the adjacent wirings may occur, and the short circuit may occur between the wirings, in some cases.

In addition, in the case where a percentage of the pressure-sensitive toner particles having a large particle diameter increases, the sizes of the pressure-sensitive toner particles included in the pressure-sensitive toner becomes uneven. In this case, in the case where the foil is pressed against the substrate where the pressure-sensitive toner image is formed, the pressure-sensitive toner particles having a large particle diameter are easily pressed against the foil and receives high pressure from the foil, while the pressure-sensitive toner particles having a small particle diameter around the pressure-sensitive toner particles having a large particle diameter are hardly pressed against the foil and receives small pressure from the foil. Accordingly, the short circuit of the wirings may occur, due to the bonding of the foil to the portion of the pressure-sensitive toner where the pressure received from the foil is small.

That is, in the case of using the pressure-sensitive toner having a large percentage of the particles having a large particle diameter in the producing of the wiring substrate, product quality of the wiring substrate may be deteriorated.

With respect to this, in the case where the linear pressure-sensitive toner image is formed on the substrate by using the pressure-sensitive toner having a small percentage of the particle having a large particle diameter, a variation in size of the width of the pressure-sensitive toner image decreases, and a variation in size of the width of the foil formed on the pressure-sensitive toner image of the substrate also decreases. Accordingly, in the case where the wiring substrate in which plural wirings are provided in parallel at narrow intervals is produced, by forming each foil image on the plural linear pressure-sensitive toner image of the substrate, a variation in interval of the adjacent wirings decreases, and the occurrence of the short circuit between the wirings is prevented.

In the case where a percentage of the pressure-sensitive toner particles having a large particle diameter is small, the sizes of the pressure-sensitive toner particles included in the pressure-sensitive toner becomes even. In this case, in the case where the foil is pressed against the substrate where the pressure-sensitive toner image is formed, the intensively receiving of the pressure by a part of the pressure-sensitive toner from the foil is prevented, and the pressure-sensitive toner substantially receives pressure evenly. Accordingly, the area of the portion of the pressure-sensitive toner to which the foil is hardly bonded decreases, and the occurrence of the short circuit of the wirings is prevented.

That is, in the case of using the pressure-sensitive toner having a small percentage of the particles having a large particle diameter in the producing of the wiring substrate, a deterioration of product quality of the wiring substrate is prevented.

The pressure-sensitive toner used in Embodiment 2 may be a color toner including a colorant or may be a transparent toner (clear toner), and a transparent toner is preferable. In the case where the transparent toner is used as the pressure-sensitive toner and the foil image is formed on the pressure-sensitive toner image of the sheet P, the showing through of the color of the pressure-sensitive toner image is prevented, in the case where the foil image is seen by a user. In Embodiment 2, a term, transparency means transparency at least with respect to visible light. The transparent toner of Embodiment 2 substantially does not include a colorant. The expression "substantially not including" means the extent that the colored degree is recognized with the naked eyes.

In Embodiment 2, a pressure-sensitive toner having insulating properties is used.

The pressure-sensitive toner includes a binder resin. In addition, the pressure-sensitive toner may include a release agent, may include an internal additive, or may include an external additive.

In the case where the pressure-sensitive toner used in Embodiment 2 is pressurized at a temperature of 70° C. or lower, the viscosity is lowered. That is, in the case where the pressure-sensitive toner of Embodiment 2 is pressurized without heating, the viscosity is lowered.

Regarding the binder resin, the release agent, the internal additive, and the external additive, the descriptions in Embodiment 1 may also be applied to those in descriptions in Embodiment 2.

<Properties of Pressure-Sensitive Toner>

In the case where the pressure-sensitive toner used in Embodiment 2 is pressurized at a temperature of 70° C. or lower, the viscosity is lowered.

In the formation of a foil image onto the substrate where a toner image is formed, for example, in the case where foil is pressed against a resin sheet at a temperature higher than 70° C. by using the resin sheet as the substrate to bond this foil to a toner image on the resin sheet, the resin sheet may be affected and deformed due to the heat. In addition, in the case where foil is pressed against a substrate, where a heat fixing toner image is formed as an image, which is different from the toner image used for bonding the foil to the substrate, at a temperature higher than 70° C., the viscosity of the heat fixing toner image may be lowered, and the foil may be also bonded to this heat fixing toner image. That is, in the case of forming a foil image on a toner image of the substrate by pressing the foil against the substrate at a temperature higher than 70° C., product quality of the wiring substrate where the foil image is formed may be deteriorated.

With respect to this, in the case where the pressure-sensitive toner is configured so that the viscosity of the pressure-sensitive toner is lowered due to the pressurization at a temperature of 70° C. or lower, and the foil is pressed against the substrate where the pressure-sensitive toner image is formed, without heating, the foil is bonded to the pressure-sensitive toner and the foil image is formed on the pressure-sensitive toner image on the sheet P.

In this case, the deformation of the substrate is prevented due to a small calorie applied to the substrate. In addition, even in the case where the heat fixing toner image is formed on the substrate, the viscosity of the heat fixing toner image is hardly lowered, and thus, the bonding of the foil to the heat fixing toner image is prevented. That is, a deterioration of product quality of the wiring substrate is prevented.

Regarding the pressure-sensitive toner of Embodiment 2, the description of the "Properties of Pressure-Sensitive Toner" of Embodiment 1 may be applied.

<Producing Method of Pressure-Sensitive Toner>

Next, a producing method of the pressure-sensitive toner used in Embodiment 2 will be described.

A producing method of the pressure-sensitive toner used in Embodiment 2 is not particularly limited and examples thereof include a kneading and pulverizing method, an emulsion aggregating method, a dissolution and suspension method, a suspension polymerization method, and a P×P method. Among these, the emulsion aggregating method and dissolution and suspension method are preferable.

Specifically, the descriptions regarding the emulsion aggregating method and dissolution and suspension method in Embodiment 1 may be applied to.

<Description of Foil>

Next, the foil will be described.

Figure 6:
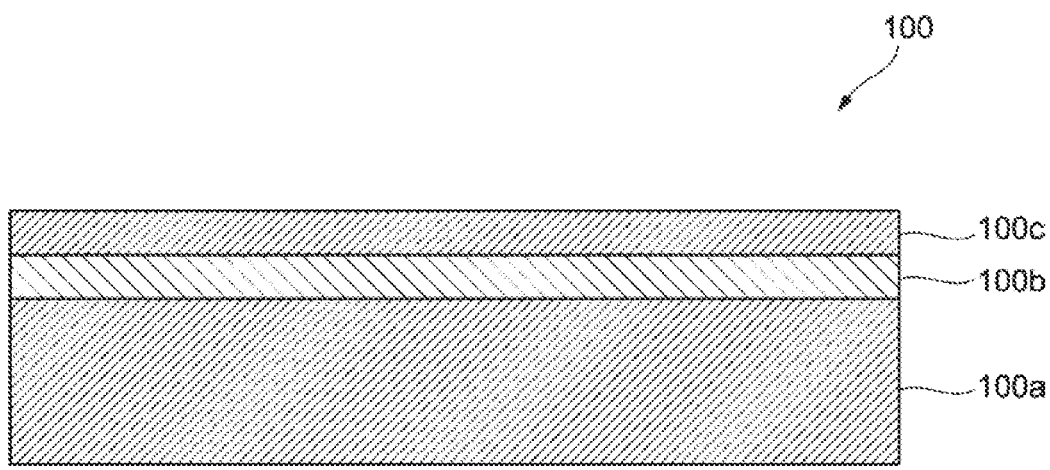
FIG. 6 is a diagram showing a configuration of foil of Embodiment 2.

FIG. 6 is a diagram showing a configuration of a foil 100 of Embodiment 2.

The foil 100 is formed in a film shape and includes a base material 100a, a release layer 100b, and a foil layer 100c.

In the foil 100, the base material 100a, the release layer 100b, and the foil layer 100c are layered in this order from the lower side of the drawing.

The base material 100a is a support of the release layer 100b and the foil layer 100c. As the base material 100a, a resin sheet or a resin film is used, for example. Examples of the resin include polyethylene terephthalate (PET), polyethylene naphthalate (PEN), polypropylene (PP), polyethersulfone, and polyimide. The base material 100a may have a single layer structure or a multilayer structure.

The release layer 100b is a layer having a function of ensuring peeling properties of the foil layer 100c from the base material 100a. As a material used in the release layer 100b, a material obtained by adding wax to a thermosetting resin, an ultraviolet curable resin, or an electron beam curable resin is used. As the thermosetting resin, for example, a resin using melamine or isocyanate as a curing agent, is used. As the ultraviolet curable resin and the electron beam curable resin, a resin including acrylate or an epoxy resin is used. Examples of wax include a fluorine monomer, a silicon monomer, a fluorine polymer, and a silicon polymer. The material used in the release layer 100b may be used singly or in combination of two or more kinds thereof.

The foil layer 100c includes a metal layer including a metal material and has conductivity.

The metal layer is, for example, formed by a vapor deposition method using a metal material, a sputtering method, or an ion plating method. Examples of the metal material include aluminum, tin, silver, chromium nickel, gold, nickel-chromium-iron alloy, bronze, and aluminum-made copper.

<Description of Foil Formation Section>

Regarding the foil formation section, the description regarding the foil formation section 80 of Embodiment 1 may be applied to.

<Method of Producing Wiring Substrate>

FIG. 4 is a flowchart for describing the method of producing the foil formed member of Embodiment 1 as described above, but is also a flowchart for describing a method of producing the wiring substrate of Embodiment 2, and the description regarding the method of producing the foil formed member of Embodiment 1 of FIG. 4 may also be applied to.

However, in Embodiment 2, the sheet P where the pressure-sensitive toner image is formed is transported to the foil formation section 80. In the case where the sheet P gets in between the foil transfer roll 83 (see FIG. 3) and the opposing roll 84, the foil transfer roll 83 presses the foil 100 against the sheet P at a temperature of 70° C. or lower. The viscosity of the pressure-sensitive toner of the pressure-sensitive toner image formed on the sheet P is lowered due to the pressing of the foil 100, and the toner is fixed to the foil layer 100c of the foil 100 (see FIG. 2). The foil layer 100c of the foil 100 where the pressure-sensitive toner image is superimposed, is peeled off from the base material 100a. Accordingly, the foil image (foil layer 100c of the foil 100) is formed on the pressure-sensitive toner image of the sheet P (S104: foil formation step).

By peeling off the foil layer 100c of the foil 100 held by the foil formation section 80, the remaining base material 100a and a portion of the foil image which is not formed on the sheet P are wound by the winding roll 82.

Through these steps, the wiring substrate is obtained. In the foil formation step, since the foil image is formed on the sheet P without heating the sheet P, the viscosity of the heat fixing toner of the heat fixing toner image formed on the sheet P is hardly lowered, and the foil is hardly bonded to the heat fixing toner. Accordingly, on the sheet P, the foil is not formed on the heat fixing toner image and the foil image is formed on the pressure-sensitive toner image.

A semiconductor element may be attached to the obtained wiring substrate (attachment step). In this case, the pressure-sensitive toner image forming step and the foil image formation step also function as a wiring substrate preparation step of preparing a wiring substrate.

A method of attaching the semiconductor element to the wiring substrate is not particularly limited, and a method of attaching a terminal to the wiring by using a stapler including a conductive staple, in a state where the terminal of the semiconductor element is in contact with the wiring of the wiring substrate, is used. For example, a method of soldering of the terminal of the semiconductor element to the wiring by using a room-temperature solidification type conductive adhesive or soldering iron including conductive soldering is used.

The semiconductor element is not particularly limited and examples thereof include a diode, a transistor, and a thyristor.

Through the steps described above, an integrated circuit in which the semiconductor element is attached to the wiring substrate is obtained.

In the case of forming the heat fixing toner image or the foil image on the substrate to which the semiconductor element is attached, by using the image forming apparatus 1, the semiconductor element may be damaged during the heating or pressurizing performed with respect to the substrate by the image forming apparatus 1. In the case where the foil image is formed on the substrate to which the semiconductor element is attached, and a level difference occurs between a portion of the substrate to which the semiconductor element is attached and a portion thereof where the semiconductor element is not attached, the foil image is hardly formed on the portion of the level difference.

With respect to this, in Embodiment 2, the semiconductor element is attached to the substrate where the wiring is formed. In this case, the damage on the semiconductor element by the image forming apparatus 1 is stopped. In addition, the foil image is easily formed on the substrate.

In Embodiment 2, in the foil image formation step, by pressing and pressurizing an integrally formed film-shaped foil 100 against the sheet P, the foil image is formed on the pressure-sensitive toner image of the sheet P.

In this case, as compared with the case of forming plural foil images which are separately formed on the sheet P, the generation of a portion where the foil image is not formed on the pressure-sensitive toner image of the sheet P is prevented.

Modification Example

In Embodiment 2, the foil formation section 80 (see FIG. 3) forms the foil image as the wiring on the pressure-sensitive toner image of the sheet P by pressing the integrally formed foil 100 against the sheet P, but a configuration necessary for forming the foil image as the wiring on the sheet P is not limited to the example described above.

FIG. 5 is a diagram showing a foil formation section 90 as a modification example.

The description regarding the modification example of Embodiment 1 may be applied to the description regarding modification example of Embodiment 2.

However, for example, in the case of forming the integrally formed foil image on the sheet P, as the configuration shown in FIG. 6, a portion of the foil 100 held by the foil formation section 80, where the foil layer 100c does not remain, is not used in the next foil image formation. In addition, a peripheral portion of the portion where the foil layer 100c does not remain (portion where the foil layer 100c remains) is not used in the next foil image formation, either.

With respect to this, in the case of using the plural foils 110 which are separately formed, on the sheet P, as the configuration shown in the modification example, the foils 110, among the foils 110 held by the foil transfer roll 92, which are not transferred onto the sheet P are continued to be held by the foil transfer roll 92 and are used in the next foil image formation. In this case, the amount of the foils 110 used in the next foil image formation increases.

In Embodiment 2, the example in which the sheet P is used as the substrate has been described, but the substrate is not particularly limited, as long as the foil image may be formed thereon or the semiconductor element may be attached thereto. For example, a resin sheet or a resin film may be used as the substrate.

In Embodiment 2, the pressure-sensitive toner image formation section 70 and the foil formation section 80 are provided in the image forming apparatus 1, but there is no limitation.

For example, separately from the image forming apparatus 1, a configuration of a foil forming apparatus including a pressure-sensitive toner image formation section and a foil formation section may be used. In this case, first, a heat fixing toner image is formed on a substrate using the image forming apparatus. Then, the substrate on which the heat fixing toner image is formed is taken out from the image forming apparatus, and a pressure-sensitive toner image is formed on this substrate by using the pressure-sensitive toner image formation section. The foil is pressed against the substrate on which the pressure-sensitive toner image is formed, by using the foil formation section, and the foil image may be formed on the pressure-sensitive toner image of the substrate.

In addition, the pressure-sensitive toner image formation section and the foil formation section may be provided in separate apparatuses. Further, the pressure-sensitive toner image may be formed without forming the heat fixing toner image on the substrate, and the foil image may be formed on this pressure-sensitive toner image.

EXAMPLES

Hereinafter, Embodiment 1 will be described in detail with reference to examples. The present invention is not limited to these examples, as long as it does not depart from the scope thereof.

The foil formed member is produced and evaluations are performed. Test conditions and evaluation results are shown in Table 1.

Example 1

[Preparation of High Tg Resin Particle Dispersion (1) by Emulsion Aggregating Method]

First, in order to prepare a high Tg resin particle dispersion, the following samples are prepared.

Styrene: 450 parts by weight
n-butyl acrylate: 150 parts by weight
Acrylic acid: 12 parts by weight
Dodecanethiol: 9 parts by weight The samples are mixed and dissolved and a mixed solution is prepared. 20 parts by weight of the anionic surfactant (manufactured by The Dow Chemical Company: DOWFAX (registered trademark) 2A1) is added and dissolved in 250 parts by weight of ion exchange water in a flask, the prepared mixed solution is added, dispersed and emulsified in the flask, and a monomer emulsified solution is prepared.

In addition, 3 parts by weight of the anionic surfactant is added and dissolved in 555 parts by weight of ion exchange water in a flask for polymerization. While injecting and stirring nitrogen to the sealed flask for polymerization through a reflux tube, the solution in the flask for polymerization is heated to 75° C. by using water bath.

A material obtained by dissolving 9 parts by weight of ammonium persulfate to 43 parts by weight of ion exchange water is added dropwise into the flask for polymerization through a constant rate pump for 20 minutes. After that, the prepared monomer emulsified solution is added dropwise into the flask for polymerization through a constant rate pump for 200 minutes.

While stirring the flask for polymerization, this flask for polymerization is held at 75° C. for 3 hours and the polymerization is finished. Accordingly, a high Tg resin particle dispersion (1) is obtained. Regarding the high Tg resin particles in this dispersion, a median diameter is 75 nm, a glass transition temperature is 51° C., a weight average molecular weight is 29,000, and a solid content is 42% by weight.

[Preparation of Low Tg Resin Particle Dispersion (1) by Emulsion Aggregating Method]

In order to prepare a low Tg resin particle dispersion, the following samples are prepared.

Styrene: 100 parts by weight
n-butyl acrylate: 500 parts by weight
Acrylic acid: 12 parts by weight
Dodecanethiol: 9 parts by weight The samples are mixed and dissolved and a mixed solution is prepared. 20 parts by weight of the anionic surfactant (manufactured by The Dow Chemical Company: DOWFAX 2A1) is added and dissolved in 250 parts by weight of ion exchange water in a flask, the prepared mixed solution is added, dispersed and emulsified in the flask, and a monomer emulsified solution is prepared.

In addition, 3 parts by weight of the anionic surfactant is added and dissolved in 555 parts by weight of ion exchange water in a flask for polymerization. While injecting and stirring nitrogen to the sealed flask for polymerization through a reflux tube, the solution in the flask for polymerization is heated to 75° C. by using water bath.

A material obtained by dissolving 9 parts by weight of ammonium persulfate to 43 parts by weight of ion exchange water is added dropwise into the flask for polymerization through a constant rate pump for 20 minutes. After that, the prepared monomer emulsified solution is added dropwise into the flask for polymerization through a constant rate pump for 200 minutes.

While stirring the flask for polymerization, this flask for polymerization is held at 75° C. for 3 hours and the polymerization is finished. Accordingly, a low Tg resin particle dispersion (1) is obtained. Regarding the low Tg resin particles in this dispersion, a median diameter is 50 nm, a glass transition temperature is 10° C., a weight average molecular weight is 26,000, and a solid content is 42% by weight.

[Preparation of Pressure-Sensitive Toner Particles]

In order to prepare the pressure-sensitive toner particles, the following samples are prepared.

High Tg resin particle dispersion (1): 100 parts by weight
  (42 parts by weight of high Tg resin particles)
Low Tg resin particle dispersion (1): 100 parts by weight
  (42 parts by weight of low Tg resin particles)
Polyaluminum chloride: 0.15 parts by weight
Ion exchange water: 300 parts by weight The above samples are put into a round stainless steel flask, the solution in the flask is mixed and dispersed by using a homogenizer (manufactured by IKA Works. Inc.: ULTRA TURRAX (registered trademark) T50), and the solution in the flask is heated to 42° C., while stirring the flask using an oil bath for heating, and held for 60 minutes. After that, in order to form the shell of the pressure-sensitive toner particle, 100 parts by weight of the high Tg resin particle dispersion (1) (21 parts by weight of high Tg resin particles) is added to the flask and gently stirred.

The pH is adjusted to 5.5 by adding an aqueous sodium hydroxide solution of 0.5 mol/L, and the solution in the flask is heated to 90° C. while continuing the stirring of the flask. Here, the aqueous sodium hydroxide solution is added into the flask and the pH is adjusted to be more than 5.0.

After finishing the reaction of the solution in the flask, the solution is cooled and filtered. The filtered solution is washed using ion exchange water and solid-liquid separation is performed by Nutsche type filtering. The obtained solid is added and re-dispersed in ion exchange water at 40° C., and stirred by using a stainless steel impeller at 100 rpm for 15 minutes and washed. This washing step is repeated three times, the washed solution is subjected to solid-liquid separation by Nutsche type filtering, and the amount of moisture in the solid is adjusted to 40%. The solid is dried by using a flash jet dryer in which a port airflow temperature is set as 80° C., and accordingly, pressure-sensitive toner particles are obtained.

In the case where the particle diameter of the pressure-sensitive toner particles is measured by using COULTER MULTISIZER II, a cumulative volume average particle diameter (D50v) is 6.5 μm and a volume average particle diameter distribution index (GSDv) is 1.23. A shape factor (SF1) of the pressure-sensitive toner particles is 130.

In the case where a cross section of the pressure-sensitive toner particle is observed by using a transmission electron microscope, a core-shell structure is confirmed.

In the case where T(1 MPa)-T(10 MPa) of the pressure-sensitive toner shown in Expression (1) is measured, T(1 MPa)-T(10 MPa) is 35° C.

[Preparation of Developer]

A material obtained by adding 1.5 parts by weight of hydrophobic silica (manufactured by Cabot Corporation: TS720) to 50 parts by weight of the pressure-sensitive toner particles is mixed by a sample mill and an externally added toner is obtained. The externally added pressure-sensitive toner is held for 17 hours in the atmosphere in which the temperature is 50° C. and humidity is 50%, by using a constant temperature and constant humidity chamber. In the case where the held pressure-sensitive toner is sieved by using a mesh having an aperture of 35 microns, it is confirmed that the pressure-sensitive toner does not remain on the mesh and aggregation (blocking) between the pressure-sensitive toner does not occur.

A ferrite carrier having an average particle diameter of 35 μm, in which 1% by weight of polymethyl methacrylate (manufactured by Soken Chemical & Engineering Co., Ltd.) is coated, and the pressure-sensitive toner are mixed with each other and stirred and mixed by using a ball mill for 5 minutes, and accordingly, a developer is prepared. The amount of the pressure-sensitive toner is adjusted so that the percentage of the pressure-sensitive toner with respect to the developer becomes 8% by weight.

[Preparation of Foil Formed Member]

A heat fixing toner image is formed on OK TOPKOTE manufactured by Oji Paper Co., Ltd. (A4-sized sheet: 127 g/m²) by using DOCUCENTRE C75501 manufactured by Fuji Xerox Co., Ltd. and the heat fixing process is performed.

A pressure-sensitive toner image is formed on the sheet where the heat fixing toner image is formed, by using a component in which the developer is mounted on DOCUCENTRE 450 manufactured by Fuji Xerox Co., Ltd. The long foil 100 is pressed against the sheet where the pressure-sensitive toner image is formed at the pressure of 10 MPa at a temperature of 25° C. by using the foil formation section 80 shown in FIG. 3, and the foil image is formed on the pressure-sensitive toner image of the sheet.

Through the above steps, a foil formed member of the example is produced.

Example 2

[Preparation of Resin Particles (1) by Dissolution and Suspension Method]

A high Tg resin latex using the high Tg resin particle dispersion (1) and a 2-ethylhexyl acrylate low Tg resin latex (manufactured by DIC Corporation: CE6400 (glass transition temperature: approximately −40° C.)) are mixed with each other with the solid content of 50%, respectively. The mixed resin latex is dried to remove moisture by using a warm air dryer, and resin particles (1) are obtained. The resin particles (1) are clouded to be opaque, and occurrence of phase separation is confirmed.

[Preparation of Toner Solution]

100 parts by weight of the resin particles (1), 300 parts by weight of tetrahydrofuran (THF), and 300 parts by weight of ethyl acetate are mixed with each other. The dispersion treatment of the mixed solution is performed using a ball mill for 3 hours and a toner solution is prepared.

200 parts by weight of calcium carbonate (manufactured by Maruo Calcium Co., Ltd.: LUMINUS), 5 parts by weight of an anionic surfactant (manufactured by DKS Co., Ltd.: NEOGEN (registered trademark) RK), and 400 parts by weight of ion exchange water are mixed with each other. The dispersion treatment of the mixed solution is performed by a ball mill for 2 hours. 900 parts by weight of ion exchange water is added to the mixed solution and evenly mixed by using a homogenizer, and a calcium carbonate dispersion is prepared.

[Preparation of Pressure-Sensitive Toner Particles]

While continuing the evenly mixing of the calcium carbonate dispersion using a homogenizer, the toner solution is added to the calcium carbonate dispersion and evenly emulsified, and the solution is removed for 4 hours while heating to 40° C. The calcium carbonate is dissolved by adding 400 parts by weight of hydrochloric acid of 1 mol/L. The solution is sieved by using a nylon mesh having an aperture of 15 microns, filtered and washed with ion exchange water, and solid-liquid separation is performed by Nutsche type filtering. The obtained solid is added and re-dispersed in ion exchange water at 40° C., and stirred by using a stainless steel impeller at 100 rpm for 15 minutes and washed. This washing step is repeated three times, the washed solution is subjected to solid-liquid separation by Nutsche type filtering, and the amount of moisture in the solid is adjusted to 40%. The solid is dried by using a flash jet dryer in which a port airflow temperature is set as 80° C., and accordingly, pressure-sensitive toner particles are obtained.

In the case where the particle diameter of the pressure-sensitive toner particles is measured by using COULTER MULTISIZER II, a cumulative volume average particle diameter (D50v) is 8.3 m and a volume average particle diameter distribution index (GSDv) is 1.26. A shape factor (SF1) of the pressure-sensitive toner particles is 126.

In the case where a cross section of the pressure-sensitive toner particle is observed by using a transmission electron microscope, it is confirmed that a core-shell structure in which the surface layer is formed of a particle layer of calcium carbonate is formed.

In the case where T(1 MPa)-T(10 MPa) of the pressure-sensitive toner shown in Expression (1) is measured, T(1 MPa)-T(10 MPa) is 35° C.

[Preparation of Developer]

A developer is prepared by the same method as in Example 1.

[Preparation of Foil Formed Member]

A heat fixing toner image is formed on OK TOPKOTE manufactured by Oji Paper Co., Ltd. (A4-sized sheet: 127 g/m²) by using DOCUCENTRE C75501 manufactured by Fuji Xerox Co., Ltd. and the heat fixing process is performed.

A pressure-sensitive toner image is formed on the sheet where the heat fixing toner image is formed, by using a component in which the developer is mounted on DOCUCENTRE 450 manufactured by Fuji Xerox Co., Ltd. The powdery foils 110 are pressed against the sheet where the pressure-sensitive toner image is formed at the pressure of 10 MPa at a temperature of 30° C. by using the foil formation section 90 shown in FIG. 5, and the foil image is formed on the pressure-sensitive toner image of the sheet.

Example 3

A foil formed member is produced in the same manner as in Example 1, except that the changes are made as shown in Table 1 from the Example 1.

Example 4

A foil formed member is produced in the same manner as in Example 1, except that the content of the high Tg resin particle dispersion (1) used in Example 1 is set as 50 parts by weight (21 parts by weight of high Tg resin particles), the content of the low Tg resin particle dispersion (1) is set as 100 parts by weight (42 parts by weight of low Tg resin particles), and the changes are made as shown in Table 1.

In the case where the particle diameter of the pressure-sensitive toner particles is measured by using COULTER MULTISIZER II, a cumulative volume average particle diameter (D50v) is 5.9 m and a volume average particle diameter distribution index (GSDv) is 1.25. A shape factor (SF1) of the pressure-sensitive toner particles is 130.

Comparative Examples 1 and 2

A foil formed member is produced in the same manner as in Example 1, except that the changes are made as shown in Table 1 from Example 1.

preparation of the pressure-sensitive toner particles, the sample is put into a round stainless steel flask, the solution in the flask is mixed and dispersed by using a homogenizer (manufactured by IKA Works, Inc.: ULTRA TURRAX (registered trademark) T50), and the solution in the flask is heated to 42° C., while stirring the flask using an oil bath for heating, and held for 60 minutes, and a toner is granulated, without adding the high Tg resin particle dispersion (1). Accordingly, a toner not having a core-shell structure is produced.

In the case where the particle diameter of the pressure-sensitive toner particles is measured by using COULTER MULTISIZER II, a cumulative volume average particle diameter (D50v) is 6.7 µm and a volume average particle diameter distribution index (GSDv) is 1.29.

A shape factor (SF1) of the pressure-sensitive toner particles is 133.

In Comparative Example 3, a measurement value of T(1 MPa)-T(10 MPa) shown in Expression (1) is 15° C. which is lower than 20° C.

In the case where the toner of Comparative Example 3 is stored at a temperature of 50° C. and humidity of 50% for 17 hours as the externally added toner which is the same as that in Example 1, aggregates of toner (blocking) are generated.

TABLE 1

| | Kind of formed member | Formation and heat fixing of heat fixing toner image | Properties of toner to which foil is to be bonded | | Temperature at which the foil is pressed against formed member | Deformation of foil formed member | Fixing properties of foil | Foil image on heat fixing toner image |
|---|---|---|---|---|---|---|---|---|
| | | | Core-shell structure | T(1 MPa)-T(10 MPa) | | | | |
| Example 1 | Sheet | Performed | Observed | 35° C. | 25° C. | Not observed | A | Not observed |
| Example 2 | Sheet | Performed | Observed | 35° C. | 30° C. | Not observed | A | Not observed |
| Example 3 | Resin sheet | Not performed | Observed | 35° C. | 60° C. | Not observed | A | |
| Example 4 | Sheet | Performed | Observed | 18° C. | 50° C. | Not observed | B | Not observed |
| Comparative Example 1 | Sheet | Performed | Observed | 35° C. | 100° C. | Not observed | A | Observed |
| Comparative Example 2 | Resin sheet | Not performed | Observed | 35° C. | 80° C. | Observed | A | |
| Comparative Example 3 | Sheet | Performed | Not observed | 15° C. | 30° C. | Not observed | C | Not observed |

That is, in Comparative Example 1, the foil is pressed against the sheet as the formed member at 100° C. which is higher than 70° C.

In Comparative Example 2, the foil is pressed against a polyethylene sheet having a thickness of 20 microns which is a resin sheet as the formed member at 80° C. which is higher than 70° C.

Comparative Example 3

A foil formed member is produced in the same manner as in Example 1, except that the changes shown in Table 1 and the changes shown as follows are made from Example 1.

That is, the content of the high Tg resin particle dispersion (1) used in Example 1 is set as 20 parts by weight (8.4 parts by weight of high Tg resin particles), and the content of the low Tg resin particle dispersion (1) is set as 100 parts by weight (42 parts by weight of low Tg resin particles). In the

[Evaluation of Deformation of Foil Formed Member]

The deformation of the foil formed members of Examples 1 to 4 and Comparative Examples 1 to 3 is evaluated.

Specifically, the foil formed members are visually observed and the deformation of the foil formed member is evaluated. The evaluation criteria are as follows. In the following evaluation criteria, the evaluation as "not observed" is set as passed and the evaluation as "observed" is set as failed.

Not observed: deformation or wrinkles of the foil formed member is not observed.

Observed: deformation or wrinkles of the foil formed member is observed.

[Evaluation of Fixing Properties of Foil]

Fixing properties of the foil of the foil formed members of Examples 1 to 4 and Comparative Examples 1 to 3 are evaluated.

Specifically, the foil formed members are visually observed, and the fixing properties of each foil image formed on the toner image of the foil formed member (toner image used for bonding the foil) are evaluated. The evaluation criteria are as follows. In the following evaluation criteria, the evaluation of A and B is set as passed and the evaluation of C is set as failed.

A: foil does not float from the foil formed member and the foil is not peeled off, even in the case of being rubbed by fingers B: foil does not float from the foil formed member, but a part of foil is peeled off, in the case of being rubbed by fingers C: foil partially floats from the foil formed member, and the foil may be easily peeled off by fingers

[Evaluation of Foil Image Formed on Heat Fixing Toner Image]

The foil image formed on the heat fixing toner image of the foil formed members of Examples 1 to 4 and Comparative Examples 1 to 3 are evaluated.

Specifically, the foil formed members are visually observed, and it is evaluated whether or not the foil image is formed on the heat fixing toner image of the foil formed member. The evaluation criteria are as follows. In the following evaluation criteria, the evaluation as "not observed" is set as passed and the evaluation as "observed" is set as failed.

Not observed: foil image is not formed on the heat fixing toner image of the foil formed member Observed: at least a part of foil image is formed on the heat fixing toner image of the foil formed member

[Evaluation Result of Deformation of Foil Formed Member]

The evaluation result of the deformation of the foil formed member is shown in Table 1.

Neither of the deformation and wrinkles are observed in any foil formed member of Examples 1 to 4.

On the other hand, in the foil formed member of Comparative Example 2, the occurrence of shrinkage is confirmed. This may be because that, in Comparative Example 2, in the case where the foil is pressed against the resin sheet as the formed member at 80° C. which is higher than 70° C., this resin sheet is deformed due to a large calorie received by the resin sheet.

[Evaluation Result of Fixing Properties of Foil]

The evaluation result of the fixing properties of the foil is shown in Table 1.

In the foil formed member of Examples 1 to 4, no foil floats from the foil formed member. Particularly, in the foil formed member of Examples 1 to 3, the foil is not peeled off, even in the case of being rubbed by fingers. This is because that, the pressure-sensitive toner used in foil formed member of Examples 1 to 3 satisfies Expression (1) and has significant has baroplastic properties, and accordingly, the viscosity of the pressure-sensitive toner is easily lowered and adhesiveness of the pressure-sensitive toner to the foil is strong, in the case where the pressure-sensitive toner is pressed against the foil.

On the other hand, in the foil formed member of Comparative Example 3, a part of the foil floats from the foil formed member. This is because that, the toner used in Comparative Example 3 (toner used for bonding the foil) is a so-called toner not having plasticity which does not have a core-shell structure and does not satisfy Expression (1), and the viscosity of the toner is lowered, even in the case where the foil is pressed against this toner at a temperature of 70° C. or lower, and the force of bonding the foil of the toner to the formed member is weak.

[Evaluation Result of Foil Image Formed on Heat Fixing Toner Image]

The evaluation result of the foil image formed on the heat fixing toner image is shown in Table 1.

In the foil formed members of Examples 1, 2, and 4, no foil image is formed on the heat fixing toner image.

On the other hand, in the foil formed member of Comparative Example 1, a part of foil is formed on the heat fixing toner image. This is because that, in Comparative Example 1, in the case where the foil is pressed against the sheet at 100° C. which is higher than 70° C., the viscosity of the heat fixing toner of the heat fixing toner image formed on the sheet is lowered, and this heat fixing toner is bonded to the foil.

From the results of Examples 1 to 4 and Comparative Examples 1 to 3, it is confirmed that the foil is pressed and pressurized against the formed member where the toner image having plasticity at a temperature of 70° C. or lower, it is necessary to form the foil image on the toner image having plasticity of the formed member.

Hereinafter, Embodiment 2 will be described in detail with reference to examples. The present invention is not limited to these examples, as long as it does not depart from the scope thereof.

The wiring substrate is produced and evaluations are performed. Test conditions are shown in Table 2.

Example 1A

[Preparation of High Tg Resin Particle Dispersion (1) by Emulsion Aggregating Method]

First, in order to prepare a high Tg resin particle dispersion, the following samples are prepared.

Styrene: 450 parts by weight
n-butyl acrylate: 150 parts by weight
Acrylic acid: 12 parts by weight
Dodecanethiol: 9 parts by weight The samples are mixed and dissolved and a mixed solution is prepared. 20 parts by weight of the anionic surfactant (manufactured by The Dow Chemical Company: DOWFAX (registered trademark) 2A1) is added and dissolved in 250 parts by weight of ion exchange water in a flask, the prepared mixed solution is added, dispersed and emulsified in the flask, and a monomer emulsified solution is prepared.

In addition, 3 parts by weight of the anionic surfactant is added and dissolved in 555 parts by weight of ion exchange water in a flask for polymerization. While injecting and stirring nitrogen to the sealed flask for polymerization through a reflux tube, the solution in the flask for polymerization is heated to 75° C. by using water bath.

A material obtained by dissolving 9 parts by weight of ammonium persulfate to 43 parts by weight of ion exchange water is added dropwise into the flask for polymerization through a constant rate pump for 20 minutes. After that, the prepared monomer emulsified solution is added dropwise into the flask for polymerization through a constant rate pump for 200 minutes.

While stirring the flask for polymerization, this flask for polymerization is held at 75° C. for 3 hours and the polymerization is finished. Accordingly, a high Tg resin particle dispersion (1) is obtained. Regarding the high Tg resin particles in this dispersion, a median diameter is 75 nm, a glass transition temperature is 51° C., a weight average molecular weight is 29,000, and a solid content is 42% by weight.

[Preparation of Low Tg Resin Particle Dispersion (1) by Emulsion Aggregating Method]

In order to prepare a low Tg resin particle dispersion, the following samples are prepared.

Styrene: 100 parts by weight
n-butyl acrylate: 500 parts by weight
Acrylic acid: 12 parts by weight
Dodecanethiol: 9 parts by weight The samples are mixed and dissolved and a mixed solution is prepared. 20 parts by weight of the anionic surfactant (manufactured by The Dow Chemical Company: DOWFAX 2A1) is added and dissolved in 250 parts by weight of ion exchange water in a flask, the prepared mixed solution is added, dispersed and emulsified in the flask, and a monomer emulsified solution is prepared.

In addition, 3 parts by weight of the anionic surfactant is added and dissolved in 555 parts by weight of ion exchange water in a flask for polymerization. While injecting and stirring nitrogen to the sealed flask for polymerization through a reflux tube, the solution in the flask for polymerization is heated to 75° C. by using water bath.

A material obtained by dissolving 9 parts by weight of ammonium persulfate to 43 parts by weight of ion exchange water is added dropwise into the flask for polymerization through a constant rate pump for 20 minutes. After that, the prepared monomer emulsified solution is added dropwise into the flask for polymerization through a constant rate pump for 200 minutes.

While stirring the flask for polymerization, this flask for polymerization is held at 75° C. for 3 hours and the polymerization is finished. Accordingly, a low Tg resin particle dispersion (1) is obtained. Regarding the low Tg resin particles in this dispersion, a median diameter is 50 nm, a glass transition temperature is 10° C., a weight average molecular weight is 26,000, and a solid content is 42% by weight.

[Preparation of Pressure-Sensitive Toner Particles]

In order to prepare the pressure-sensitive toner particles, the following samples are prepared.

High Tg resin particle dispersion (1): 100 parts by weight
(42 parts by weight of high Tg resin particles)
Low Tg resin particle dispersion (1): 100 parts by weight
(42 parts by weight of low Tg resin particles)
Polyaluminum chloride: 0.15 parts by weight
Ion exchange water: 300 parts by weight The above samples are put into a round stainless steel flask, the solution in the flask is mixed and dispersed by using a homogenizer (manufactured by IKA Works, Inc.: ULTRA TURRAX (registered trademark) T50), and the solution in the flask is heated to 42° C., while stirring the flask using an oil bath for heating, and held for 60 minutes. After that, in order to form the shell of the pressure-sensitive toner particle, 100 parts by weight of the high Tg resin particle dispersion (1) (21 parts by weight of high Tg resin particles) is added to the flask and gently stirred.

The pH is adjusted to 5.5 by adding an aqueous sodium hydroxide solution of 0.5 mol/L, and the solution in the flask is heated to 90° C. while continuing the stirring of the flask. Here, the aqueous sodium hydroxide solution is added into the flask and the pH is adjusted to be more than 5.0.

After finishing the reaction of the solution in the flask, the solution is cooled and filtered. The filtered solution is washed using ion exchange water and solid-liquid separation is performed by Nutsche type filtering. The obtained solid is added and re-dispersed in ion exchange water at 40° C., and stirred by using a stainless steel impeller at 100 rpm for 15 minutes and washed. This washing step is repeated three times, the washed solution is subjected to solid-liquid separation by Nutsche type filtering, and the amount of moisture in the solid is adjusted to 40%. The solid is dried by using a flash jet dryer in which a port airflow temperature is set as 80° C., and accordingly, pressure-sensitive toner particles are obtained.

In the case where the particle diameter of the pressure-sensitive toner particles is measured by using COULTER MULTISIZER II, a cumulative volume average particle diameter (D50v) is 6.5 μm, a volume average particle diameter distribution index (GSDv) is 1.23, and a volume fraction of the pressure-sensitive toner particles having a particle diameter of 16 μm or more is 0.2% which is less than 1%. A shape factor (SF1) of the pressure-sensitive toner particles is 130.

In the case where a cross section of the pressure-sensitive toner particle is observed by using a transmission electron microscope, a core-shell structure is confirmed.

In the case where T(1 MPa)-T(10 MPa) of the pressure-sensitive toner shown in Expression (1) is measured. T(1 MPa)-T(10 MPa) is 35° C.

[Preparation of Developer]

A material obtained by adding 1.5 parts by weight of hydrophobic silica (manufactured by Cabot Corporation: TS720) to 50 parts by weight of the pressure-sensitive toner particles is mixed by a sample mill and an externally added toner is obtained. The externally added pressure-sensitive toner is held for 17 hours in the atmosphere in which the temperature is 50° C. and humidity is 50%, by using a constant temperature and constant humidity chamber. In the case where the held pressure-sensitive toner is sieved by using a mesh having an aperture of 35 microns, it is confirmed that the pressure-sensitive toner does not remain on the mesh and aggregation (blocking) between the pressure-sensitive toner does not occur.

A ferrite carrier having an average particle diameter of 35 μm, in which 1% by weight of polymethyl methacrylate (manufactured by Soken Chemical & Engineering Co., Ltd.) is coated, and the pressure-sensitive toner are mixed with each other and stirred and mixed by using a ball mill for 5 minutes, and accordingly, a developer is prepared. The amount of the pressure-sensitive toner is adjusted so that the percentage of the pressure-sensitive toner with respect to the developer becomes 8% by weight.

[Preparation of Wiring Substrate]

A heat fixing toner image is formed on OK TOPKOTE manufactured by Oji Paper Co., Ltd. (A4-sized sheet: 127 g/m$^2$) by using DOCUCENTRE C75501 manufactured by Fuji Xerox Co., Ltd. and the heat fixing process is performed.

A pressure-sensitive toner image is formed on the sheet where the heat fixing toner image is formed, by using a component in which the developer is mounted on DOCUCENTRE 450 manufactured by Fuji Xerox Co., Ltd. The long foil 100 is pressed against the sheet where the pressure-sensitive toner image is formed at the pressure of 10 MPa at a temperature of 30° C. by using the foil formation section 80 shown in FIG. 3, and the foil image is formed on the pressure-sensitive toner image of the sheet.

Through the above steps, a wiring substrate of the example is produced.

Example 2A

[Preparation of Resin Particles (1) by Dissolution and Suspension Method]

A high Tg resin latex using the high Tg resin particle dispersion (1) and a 2-ethylhexyl acrylate low Tg resin latex (manufactured by DIC Corporation: CE6400 (glass transition temperature: approximately −40° C.)) are mixed with each other with the solid content of 50%, respectively. The mixed resin latex is dried to remove moisture by using a warm air dryer, and resin particles (1) are obtained. The resin particles (1) are clouded to be opaque, and occurrence of phase separation is confirmed.

[Preparation of Toner Solution]

100 parts by weight of the resin particles (1), 300 parts by weight of tetrahydrofuran (THF), and 300 parts by weight of ethyl acetate are mixed with each other. The dispersion treatment of the mixed solution is performed using a ball mill for 3 hours and a toner solution is prepared.

200 parts by weight of calcium carbonate (manufactured by Maruo Calcium Co., Ltd.: LUMINUS), 5 parts by weight of an anionic surfactant (manufactured by DKS Co., Ltd.: NEOGEN (registered trademark) RK), and 400 parts by weight of ion exchange water are mixed with each other. The dispersion treatment of the mixed solution is performed by a ball mill for 2 hours. 900 parts by weight of ion exchange water is added to the mixed solution and evenly mixed by using a homogenizer, and a calcium carbonate dispersion is prepared.

[Preparation of Pressure-Sensitive Toner Particles]

While continuing the evenly mixing of the calcium carbonate dispersion using a homogenizer, the toner solution is added to the calcium carbonate dispersion and evenly emulsified, and the solution is removed for 4 hours while heating to 40° C. The calcium carbonate is dissolved by adding 400 parts by weight of hydrochloric acid of 1 mol/L. The solution is sieved by using a nylon mesh having an aperture of 15 microns, filtered and washed with ion exchange water, and solid-liquid separation is performed by Nutsche type filtering. The obtained solid is added and re-dispersed in ion exchange water at 40° C., and stirred by using a stainless steel impeller at 100 rpm for 15 minutes and washed. This washing step is repeated three times, the washed solution is subjected to solid-liquid separation by Nutsche type filtering, and the amount of moisture in the solid is adjusted to 40%. The solid is dried by using a flash jet dryer in which a port airflow temperature is set as 80° C., and accordingly, pressure-sensitive toner particles are obtained.

In the case where the particle diameter of the pressure-sensitive toner particles is measured by using COULTER MULTISIZER II, a cumulative volume average particle diameter (D50v) is 8.3 μm, a volume average particle diameter distribution index (GSDv) is 1.26, and a volume fraction of the pressure-sensitive toner particles having a particle diameter of 16 μm or more is 0.7% which is less than 1%. A shape factor (SF1) of the pressure-sensitive toner particles is 126.

In the case where a cross section of the pressure-sensitive toner particle is observed by using a transmission electron microscope, it is confirmed that a core-shell structure in which the surface layer is formed of a particle layer of calcium carbonate is formed.

In the case where T(1 MPa)-T(10 MPa) of the pressure-sensitive toner shown in Expression (1) is measured, T(1 MPa)-T(10 MPa) is 35° C.

[Preparation of Developer]

A developer is prepared by the same method as in Example 1A.

[Preparation of Wiring Substrate]

A heat fixing toner image is formed on OK TOPKOTE manufactured by Oji Paper Co., Ltd. (A4-sized sheet: 127 g/m²) by using DOCUCENTRE C75501 manufactured by Fuji Xerox Co., Ltd. and the heat fixing process is performed.

A pressure-sensitive toner image is formed on the sheet where the heat fixing toner image is formed, by using a component in which the developer is mounted on DOCUCENTRE 450 manufactured by Fuji Xerox Co., Ltd. The powdery foils 110 are pressed against the sheet where the pressure-sensitive toner image is formed at the pressure of 10 MPa at a temperature of 65° C. by using the foil formation section 90 shown in FIG. 5, and the foil image is formed on the pressure-sensitive toner image of the sheet.

Example 3A

A wiring substrate is produced in the same manner as in Example 1A, except that the changes are made as shown in Table 2 from Example 1A. A polyethylene sheet having a thickness of 20 microns is used as the resin sheet.

Example 4A

A foil formed member is produced in the same manner as in Example 1A, except that the content of the high Tg resin particle dispersion (1) used in Example 1A is set as 50 parts by weight (21 parts by weight of high Tg resin particles), the content of the low Tg resin particle dispersion (1) is set as 100 parts by weight (42 parts by weight of low Tg resin particles), and the changes are made as shown in Table 2.

In the case where the particle diameter of the pressure-sensitive toner particles is measured by using COULTER MULTISIZER II, a cumulative volume average particle diameter (D50v) is 5.9 μm and a volume average particle diameter distribution index (GSDv) is 1.25. A shape factor (SF1) of the pressure-sensitive toner particles is 130, and the volume fraction of the pressure-sensitive toner particles having a particle diameter of 16 μm or more is 0.5% which is less than 1%.

Comparative Examples 1A to 3A

A wiring substrate is produced in the same manner as in Example 1A, except that the changes shown in Table 2 and the changes shown as follows are made from Example 1A.

That is, in Comparative Examples 1A to 4A, a pressure-sensitive toner in which a volume fraction of the pressure-sensitive toner particles having a particle diameter of 16 μm or more is 1% or more is used.

In Comparative Example 2A, the foil is pressed against the resin sheet as the substrate at 80° C. which is higher than 70° C.

In Comparative Example 3A, the foil is pressed against the sheet as the substrate at 100° C. which is higher than 70° C.

Regarding the producing of the toners of Comparative Examples 1A to 3A, the sample is put into a round stainless steel flask, the solution in the flask is mixed and dispersed by using a homogenizer (manufactured by IKA Works, Inc.: ULTRA TURRAX (registered trademark) T50), and the solution in the flask is heated to 42° C., while stirring the flask using an oil bath for heating, and held for 60 minutes. After that, in order to form the shell of the pressure-sensitive toner particle, 100 parts by weight of the high Tg resin particle dispersion (1) (21 parts by weight of high Tg resin particles) is added to the flask and gently stirred.

The pH is adjusted to 5.0 by adding an aqueous sodium hydroxide solution of 0.5 mol/L, and the solution in the flask is heated to 90° C. while continuing the stirring of the flask. After that, in the case where the solution is allowed to stand, the pH is lowered to 4.0 and the generation of a small amount of coarse powder is observed.

In the case where the particle diameter of the toner particles of Comparative Examples 1A to 3A is measured by using COULTER MULTISIZER II, a cumulative volume average particle diameter (D50v) is 6.3 m and a volume average particle diameter distribution index (GSDv) is 1.28.

In Comparative Example 4A, a measurement value of T(1 MPa)-T(10 MPa) shown in Expression (1) is 15° C. which is lower than 20° C.

TABLE 2

| | Volume fraction of toner of 1.6 × $10^{-5}$ or more | Kind of substrate | Formation and heat fixing of heat fixing toner image | Properties of toner to which foil is to be bonded | | Temperature at which the foil is pressed against formed member |
|---|---|---|---|---|---|---|
| | | | | Core-shell structure | T(1 MPa)-T(10 MPa) | |
| Example 1A | Less than 1% | Sheet | Performed | Observed | 35° C. | 30° C. |
| Example 2A | Less than 1% | Sheet | Performed | Observed | 35° C. | 65° C. |
| Example 3A | Less than 1% | Resin sheet | Not performed | Observed | 35° C. | 60° C. |
| Example 4A | Less than 1% | Sheet | Performed | Observed | 18° C. | 50° C. |
| Comparative Example 1A | 1% or more | Sheet | Performed | Observed | 35° C. | 30° C. |
| Comparative Example 2A | 1% or more | Resin sheet | Not performed | Observed | 35° C. | 80° C. |
| Comparative Example 3A | 1% or more | Sheet | Performed | Observed | 35° C. | 100° C. |
| Comparative Example 4A | 1% or more | Sheet | Performed | Not observed | 15° C. | 30° C. |

A shape factor (SF1) of the pressure-sensitive toner particles is 122, and a volume fraction of the pressure-sensitive toner particles having a particle diameter of 16 μm or more is 1.4% which exceeds 1%.

Example 4A

A foil formed member is produced in the same manner as in Example 1A, except that the changes shown in Table 2 and the changes shown as follows are made from Example 1A.

That is, the content of the high Tg resin particle dispersion (1) used in Example 1A is set as 20 parts by weight (8.4 parts by weight of high Tg resin particles), and the content of the low Tg resin particle dispersion (1) is set as 100 parts by weight (42 parts by weight of low Tg resin particles). In the preparation of the pressure-sensitive toner particles, the sample is put into a round stainless steel flask, the solution in the flask is mixed and dispersed by using a homogenizer (manufactured by IKA Works, Inc.: ULTRA TURRAX (registered trademark) T50), and the solution in the flask is heated to 42° C., while stirring the flask using an oil bath for heating, and held for 60 minutes, and a toner is granulated, without adding the high Tg resin particle dispersion (1). Accordingly, a toner not having a core-shell structure is produced. In addition, the amount of the coarse powder is increased due to the aggregation of the toner at the time of drying.

In the case where the particle diameter of the pressure-sensitive toner particles is measured by using COULTER MULTISIZER II, a cumulative volume average particle diameter (D50v) is 6.7 μm and a volume average particle diameter distribution index (GSDv) is 1.29.
A shape factor (SF1) of the pressure-sensitive toner particles is 133, and a volume fraction of the pressure-sensitive toner particles having a particle diameter of 16 μm or more is 1.8% which exceeds 1%.

In the case where the toner of Comparative Example 4A is stored at a temperature of 50° C. and humidity of 50% for 17 hours as the externally added toner which is the same as that in Example 1A, aggregates of toner (blocking) are generated.

[Evaluation of Short Circuit]

The evaluation of the short circuit is performed regarding the wiring substrate produced in each condition of Examples 1A to 4A and Comparative Examples 1A to 4A.

FIG. 6 is a diagram showing a substrate used for the evaluation of the short circuit.

As shown in FIG. 6, three kinds of linear pressure-sensitive toner images having different sizes of width are formed on the substrate. Five images for each kind of the pressure-sensitive toner image are formed. Specifically, five images of a pressure-sensitive toner image G1 having a size of the width of approximately 0.4 mm, a pressure-sensitive toner image G2 having a size of the width of approximately 1 mm, a pressure-sensitive toner image G3 having a size of the width of approximately 2 mm, are respectively formed. All of an interval L between the adjacent pressure-sensitive toner images G1, an interval L between the adjacent pressure-sensitive toner image G2, and an interval L between the adjacent pressure-sensitive toner image G3 is set as approximately 1 mm. With respect to this substrate, each foil image is formed on the pressure-sensitive toner images G1, the pressure-sensitive toner image G2, and the pressure-sensitive toner image G3, and a wiring substrate in which five wirings having a size of the width of approximately 0.4 mm, five wirings having a size of the width of approximately 1 mm, and five wirings having a size of the width of approximately 2 mm is produced. In addition, 10 wiring substrates are produced by the method described above.

The occurrence of the short circuit is evaluated with respect to each of the obtained wiring substrates by using a digital multimeter. Specifically, one terminal of the digital multimeter is brought into contact with one of the adjacent wiring among the five wirings having a size of the width of approximately 0.4 mm, the other terminal of the digital multimeter is brought into contact with the other wiring, and the short circuit is evaluated in accordance with the conductivity. In addition, even in cases of the wirings having a size of the width of approximately 1 mm and the wirings having a size of the width of approximately 2 mm, the short circuit is evaluated in the same manner. The evaluation criteria are as follows. In the following evaluation criteria, the evaluation as A is set as passed and the evaluation as B is set as failed.

A: no short circuit is confirmed in all of the wiring substrates.

B: short circuit is confirmed one or more wiring substrates.

[Evaluation of Disconnection]

The evaluation of the disconnection of the wirings is performed regarding the wiring substrate produced in each condition of Examples 1A to 4A and Comparative Examples 1A to 4A.

Regarding each of the wiring substrate used in the evaluation of the short circuit, the disconnection of the wirings is evaluated by using a digital multimeter. Specifically, one terminal of the digital multimeter is brought into contact with an upper end portion of the wiring having a size of the width of approximately 0.4 mm, the other terminal of the digital multimeter is brought into contact with a lower end portion of the wiring, and the disconnection is evaluated in accordance with the conductivity. The disconnection is evaluated in the same manner regarding the remaining four wirings having a size of the width of approximately 0.4 mm. In addition, even in cases of the five wirings having a size of the width of approximately 1 mm and the five wirings having a size of the width of approximately 2 mm, the disconnection is evaluated in the same manner. The evaluation criteria are as follows. In the following evaluation criteria, the evaluation as A is set as passed and the evaluation as B is set as failed.

A: no disconnection between wirings is confirmed in all of the wiring substrates.

B: disconnection between wirings is confirmed one or more wiring substrates.

[Evaluation of Operation of Semiconductor Element]

An integrated circuit is produced under each condition of Examples 1A to 4A and Comparative Examples 1A to 4A, and the evaluation of the operation of the semiconductor element attached to the produced integrated circuit is performed.

Figure 7:
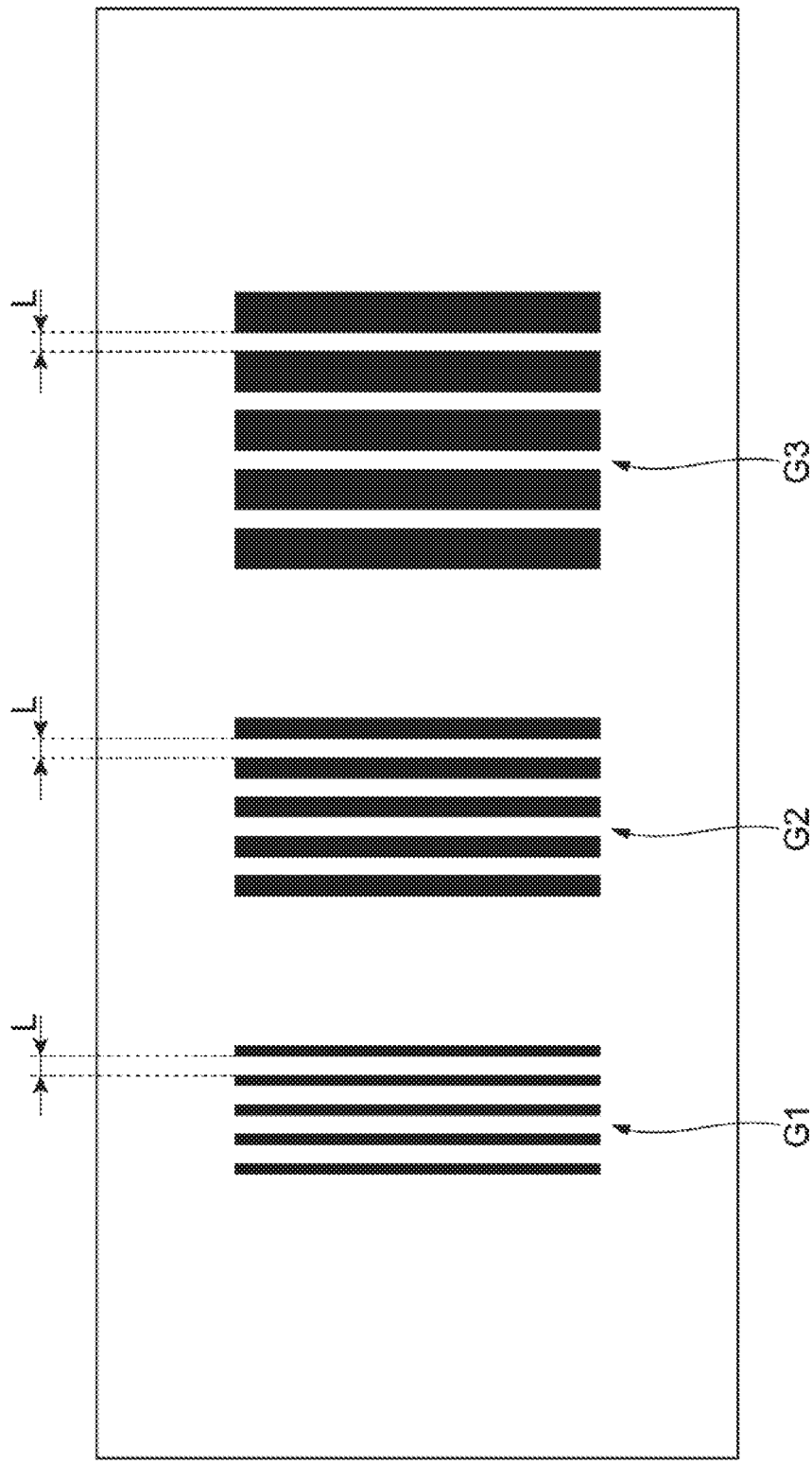
FIG. 7 is a diagram showing a substrate used for an evaluation of a short circuit.

FIG. 7 is a diagram showing an integrated circuit used for the evaluation of the operation of the semiconductor element.

Two pressure-sensitive toner images having a length of 3 cm and a width of 1 cm are formed in parallel on the substrate. An interval X of the two pressure-sensitive toner images is set as 1 cm. The foil image as the wiring is formed on each of the two pressure-sensitive toner images of the substrate and the wiring substrate is produced.

A Schottky barrier diode 200 (manufactured by Renesas Electronics Corporation: 1SS106) and a light emitting diode 300 (manufactured by OptoSupply Limited: LED OSDR3133A) are attached to this wiring substrate, and a rectenna as the integrated circuit is produced. Specifically, one terminal (terminal on the left side of the drawing) of the Schottky barrier diode 200 and one terminal (terminal on the left side of the drawing) of the light emitting diode 300 are attached to one wiring (wiring on the left side of the drawing), by using a conductive staple S polished with a file (manufactured by MAX Co., Ltd., No. 10). In addition, the other terminal (terminal on the right side of the drawing) of the Schottky barrier diode 200) and the other terminal (terminal on the right side of the drawing) of the light emitting diode 300 are attached to the other wiring (wiring on the right side of the drawing) by using the staple S.

This rectenna receives a wave of 2.4 GHz, converts the alternating current generated into the direct current by the Schottky barrier diode 200, and causes the emission of the light emitting diode 300 by the converted direct current.

The operation of the semiconductor element of the integrated circuit is evaluated whether or not the rectenna receives a wave of 2.4 GHz and causes the emission of the light emitting diode. The evaluation criteria are as follows. In the following evaluation criteria, the evaluation as A is set as passed and the evaluation as B is set as failed.

A: the light emission of the light emitting diode 300 is confirmed.

B: the light emission of the light emitting diode 300 is not confirmed.

[Evaluation of Insulating Properties Between Overlapped Wirings]

Regarding the wiring substrate produced under each condition of Examples 1A to 4A and Comparative Examples 1A to 4A, the evaluation of insulating properties between the vertically overlapped wirings is performed.

Figure 8:
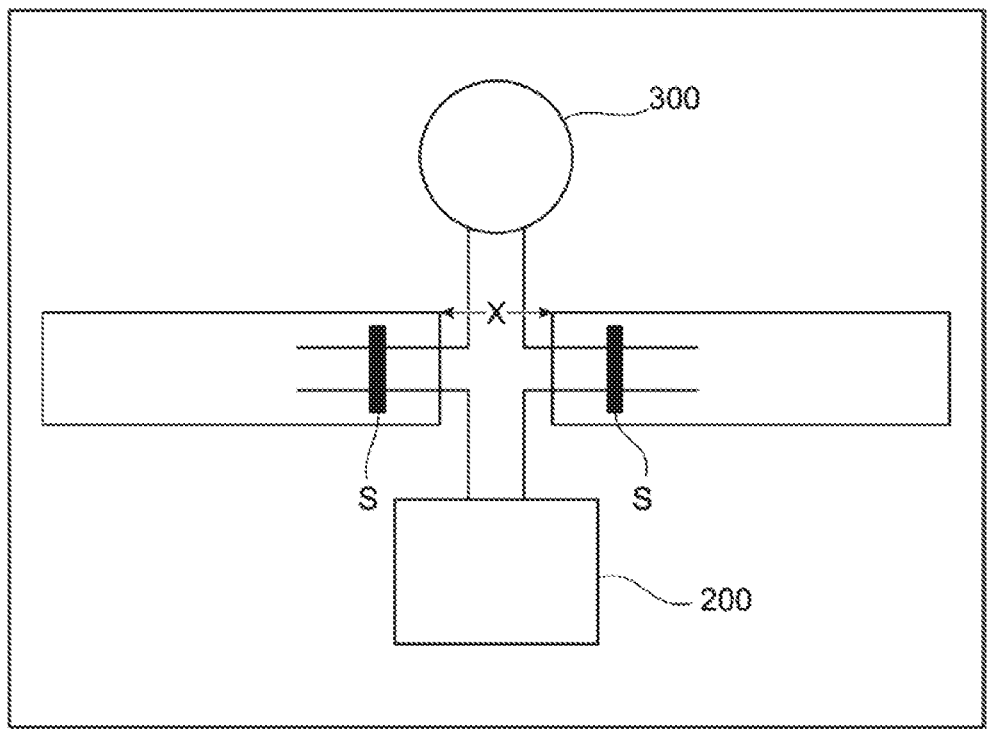
FIG. 8 is a diagram showing an integrated circuit used for an operation evaluation of a semiconductor element.
Figure 9:
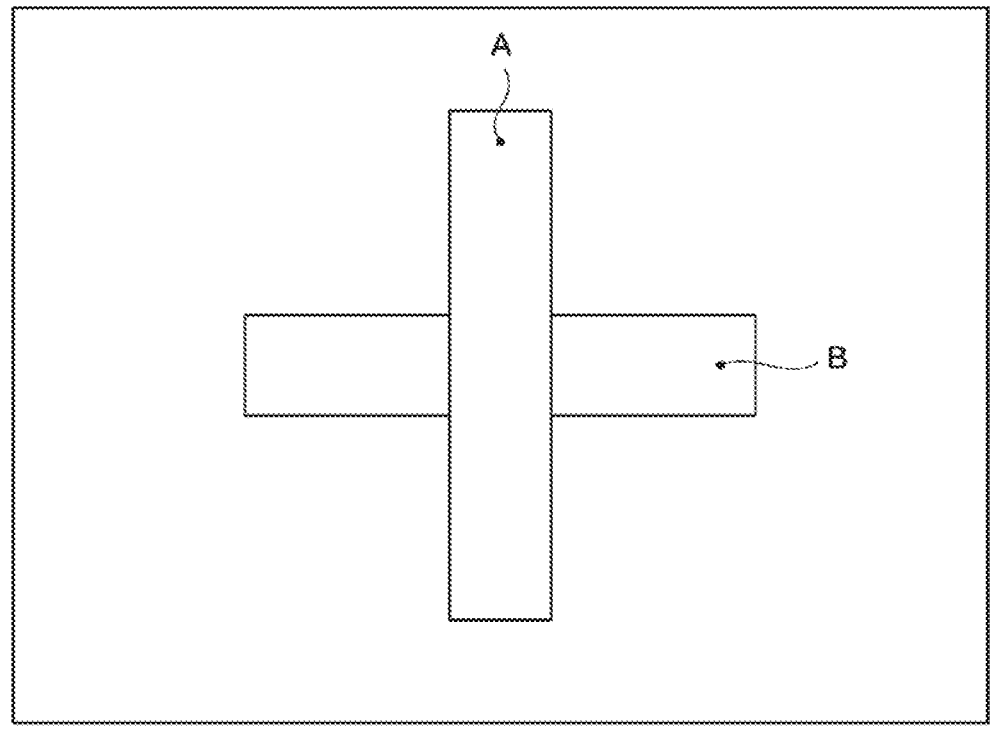
FIG. 9 is a diagram showing a wiring substrate used for an evaluation of insulating properties.

FIG. 8 is a diagram showing the wiring substrate used for evaluation of insulating properties.

A pressure-sensitive toner image having a length of 3 cm and a width of 1 cm is formed on the substrate, and the foil image as the wiring is formed on the pressure-sensitive toner image of the substrate. In addition, the pressure-sensitive toner image having a length of 3 cm and a width of 1 cm is formed on the wiring of the substrate so as to intersect with the wiring. The foil image is formed on this pressure-sensitive toner image of the substrate and the wiring substrate in which two wirings are overlapped is produced.

The insulating properties between the vertically overlapped wirings are evaluated by using a digital multimeter. Specifically, one terminal of the digital multimeter is brought into contact with a point A of the wiring of the upper layer, the other terminal thereof is brought into contact with a point B of the wiring of the lower layer, and the insulating properties are evaluated in accordance with the conductivity. The evaluation criteria are as follows. In the following evaluation criteria, the evaluation as A is set as passed and the evaluation as B is set as failed.

A: conductivity is not confirmed between the overlapped wirings.

B: conductivity is confirmed between the overlapped wirings.

[Evaluation of Deformation of Wiring Substrate]

The deformation of the wiring substrates of Examples 1A to 4A and Comparative Examples 1A to 4A is evaluated.

Specifically, the wiring substrates are visually observed and the deformation of the wiring substrate is evaluated. The evaluation criteria are as follows. In the following evaluation criteria, the evaluation as "not observed" is set as passed and the evaluation as "observed" is set as failed.

Not observed: deformation or wrinkles of the wiring substrate is not observed.

Observed: deformation or wrinkles of the wiring substrate is observed.

[Evaluation of Fixing Properties of Foil]

Fixing properties of the foil of the wiring substrates of Examples 1A to 4A and Comparative Examples 1A to 4A are evaluated.

Specifically, the wiring substrates are visually observed, and the fixing properties of each foil image formed on the toner image of the wiring substrate (toner image used for bonding the foil) are evaluated. The evaluation criteria are as follows. In the following evaluation criteria, the evaluation of A and B is set as passed and the evaluation of C is set as failed.

A: foil does not float from the wiring substrate and the foil is not peeled off, even in the case of being rubbed by fingers B: foil does not float from the wiring substrate, but a part of foil is peeled off, in the case of being rubbed by fingers C: foil partially floats from the wiring substrate, and the foil may be easily peeled off by fingers

[Evaluation of Foil Image Formed on Heat Fixing Toner Image]

The foil image formed on the heat fixing toner image of the wiring substrates of Examples 1A to 4A and Comparative Examples 1A to 4A are evaluated.

Specifically, the wiring substrates are visually observed, and it is evaluated whether or not the foil image is formed on the heat fixing toner image of the wiring substrate. The evaluation criteria are as follows. In the following evaluation criteria, the evaluation as "not observed" is set as passed and the evaluation as "observed" is set as failed.

Not observed: foil image is not formed on the heat fixing toner image of the wiring substrate.

Observed: at least a part of foil image is formed on the heat fixing toner image of the wiring substrate.

toner particles included in the pressure-sensitive toner becomes uneven, and a portion of the pressure-sensitive toner having a small pressure received from the foil occurs. Accordingly, the disconnection of the wirings occurs due to the foil which is not bonded to this portion.

[Evaluation Result of Operation of Semiconductor Element]

The evaluation result of the operation of semiconductor element is shown in Table 3.

In any of Examples 1A to 4A, the light emission of the light emitting diode 300 is confirmed in the integrated circuit.

On the other hand, in Comparative Example 2A, the light emission of the light emitting diode 300 is not confirmed in the integrated circuit. Here, in Comparative Example 2A, shrinkage occurs in the wiring substrate as will be described later, the effect is received to the reception of the wave by the integrated circuit due to this shrinkage, and the light emission of the light emitting diode 300 is not performed.

TABLE 3

|  | Short circuit | Disconnection | Operation of semiconductor element | Insulating properties between wirings | Deformation of foil formed member | Fixing properties of foil | Foil image on heat fixing toner image |
|---|---|---|---|---|---|---|---|
| Example 1A | A | A | A | A | Not observed | A | Not observed |
| Example 2A | A | A | A | A | Not observed | A | Not observed |
| Example 3A | A | A | A | A | Not observed | A | |
| Example 4A | A | A | A | A | Not observed | B | Not observed |
| Comparative Example 1A | B | B | A | A | Not observed | A | Not observed |
| Comparative Example 2A | B | B | B | A | Observed | A | |
| Comparative Example 3A | B | B | A | A | Not observed | A | Observed |
| Comparative Example 4A | B | B | A | A | Not observed | C | Not observed |

[Evaluation Result of Short Circuit]

The evaluation result of the short circuit is shown in Table 3.

In any of Examples 1A to 4A, the short circuit is not confirmed in the wiring substrate.

On the other hand, in Comparative Examples 1A to 4A, the short circuit is confirmed at least one or more wiring substrate. Here, in Comparative Examples 1A to 4A, a pressure-sensitive toner in which a volume fraction of the pressure-sensitive toner particles having a particle diameter of 16 μm or more is 1% or more is used. Accordingly, it is thought that a variation in size of the width of the pressure-sensitive toner image formed on the substrate occurs, and a variation in size of the width of the foil formed on the pressure-sensitive toner image. Accordingly, a variation occurs in the interval of the adjacent wirings and the short circuit occurs between the adjacent wirings.

[Evaluation Result of Disconnection]

The evaluation result of the disconnection is shown in Table 3.

In any of Examples 1A to 4A, the disconnection of the wirings is not confirmed in the wiring substrate.

On the other hand, in Comparative Examples 1A to 4A, the disconnection of the wirings is confirmed at least one or more wiring substrate. Here, in Comparative Examples 1A to 4A, a pressure-sensitive toner in which a volume fraction of the pressure-sensitive toner particles having a particle diameter of 16 μm or more is 1% or more is used. Accordingly, it is thought that the size of the pressure-sensitive

[Evaluation Result of Insulating Properties Between Overlapped Wirings]

The evaluation result of the insulating properties between vertically overlapped wirings is shown in Table 3.

In any of Examples 1A to 4A, the conductivity is not confirmed between the wirings of the upper and lower layers. This is because the pressure-sensitive toner having insulating properties is provided between the vertically overlapped wirings, and shows that the multilayer of the wirings may be realized.

[Evaluation Result of Deformation of Wiring Substrate]

The evaluation result of the deformation of the wiring substrate is shown in Table 3.

In any of the wiring substrates of Examples 1A to 4A, deformation and wrinkles are not confirmed.

With respect to this, the occurrence of shrinkage is confirmed in the wiring substrate of Comparative Example 2A. This is because that, in Comparative Example 2A, in the case where the foil is pressed against the resin sheet as the substrate at 80° C. which is higher than 70° C. the calorie received by the resin sheet is great and this resin sheet is deformed.

[Evaluation Result of Fixing Properties of Foil]

The evaluation result of the fixing properties of the foil is shown in Table 3.

In the wiring substrates of Examples 1A to 4A, the foil does not float from the wiring substrate. Particularly, in the wiring substrates of Examples 1A to 3A, the foil is not peeled off, even in the case where the foil is rubbed by the fingers. This is because that, the pressure-sensitive toner used in Examples 1A to 3A satisfies Expression (1) and has significant has baroplastic properties, and accordingly, the viscosity of the pressure-sensitive toner is easily lowered and adhesiveness of the pressure-sensitive toner to the foil is strong, in the case where the pressure-sensitive toner is pressed against the foil.

On the other hand, in the wiring substrate of Comparative Example 4A, a part of the foil floats from the wiring substrate. This is because that, the toner used in Comparative Example 4A (toner used for bonding the foil) is a so-called toner not having plasticity which does not have a core-shell structure and does not satisfy Expression (1), and the viscosity of the toner is lowered, even in the case where the foil is pressed against this toner at a temperature of 70° C. or lower, and the adhesiveness of the toner to the foil is weak.

[Evaluation Result of Foil Image Formed on Heat Fixing Toner Image]

The evaluation result of the foil image formed on the heat fixing toner image is shown in Table 3.

In the wiring substrates of Examples 1A, 2A, and 4A, no foil image is formed on the heat fixing toner image.

On the other hand, in the wiring substrate of Comparative Example 2A, a part of foil image is formed on the heat fixing toner image. This is because that, in Comparative Example 2A, in the case where the foil is pressed against the sheet at 100° C. which is higher than 70° C., the viscosity of the heat fixing toner of the heat fixing toner image formed on the sheet is lowered, and this heat fixing toner is bonded to the foil.

From the results of Examples 1A to 4A and Comparative Examples 1A to 4A, it is confirmed that it is preferable to form the foil image on the toner image of the substrate where the toner image of the toner having a particle diameter of 16 µm or more and a volume fraction of the toner particles of less than 1% is formed.

The foregoing description of the exemplary embodiments of the present invention has been provided for the purposes of illustration and description. It is not intended to be exhaustive or to limit the invention to the precise forms disclosed. Obviously, many modifications and variations will be apparent to practitioners skilled in the art. The embodiments were chosen and described in order to best explain the principles of the invention and its practical applications, thereby enabling others skilled in the art to understand the invention for various embodiments and with the various modifications as are suited to the particular use contemplated. It is intended that the scope of the invention be defined by the following claims and their equivalents.

What is claimed is:

1. A method of producing a foil formed member, comprising:
    preparing a formed member on which a plastic toner image having plasticity is formed by a plastic toner; and
    pressing a foil against the formed member at a temperature of 70° C. or lower to form a foil image on the plastic toner image of the formed member,
    wherein the plastic toner satisfies Expression (1):

$$20° C. \leq T(1 \text{ MPa}) - T(10 \text{ MPa}) \tag{1}$$

wherein, in expression (1), T (1 MPa), represents a temperature at which a viscosity of the plastic toner becomes $10^4$ Pa·s under an applied pressure of 1 MPa, and T (10 MPa) represents a temperature at which a viscosity of the plastic toner becomes $10^4$ Pa·s under an applied pressure of 10 MPa.

2. The method of producing a foil formed member according to claim 1,
    wherein the plastic toner is a pressure-sensitive toner whose viscosity is lowered when the foil is pressed at the temperature of 70° C. or lower.

3. The method of producing a foil formed member according to claim 2,
    wherein the pressure-sensitive toner includes a first resin and a second resin, which have different glass transition temperatures, and
    the first resin and the second resin are present with phase separation.

4. The method of producing a foil formed member according to claim 3,
    wherein the pressure-sensitive toner has a core-shell structure including a core in which the first resin and the second resin are present with phase separation, and a shell which covers the core.

5. The method of producing a foil formed member according to claim 4,
    wherein the first resin has a glass transition temperature higher than the second resin, and
    a total amount of the first resin in the shell is greater than a total amount of the second resin in the shell, in terms of parts by weight.

6. The method of producing a foil formed member according to claim 1,
    wherein, in the pressing, the foil is pressed against a region larger than a region where the plastic toner image is formed in the formed member, to form the foil image on the plastic toner image of the formed member.

7. The method of producing a foil formed member according to claim 6,
    wherein, in the pressing, an integrally formed film-shaped foil is pressed against the formed member, to form the foil image on the plastic toner image of the formed member.

8. The method of producing a foil formed member according to claim 6,
    wherein, in the pressing, a foil holding unit which holds plural powdery foils is pressed against the formed member, to form the foil image on the plastic toner image of the formed member.

9. A method of producing a wiring substrate, comprising:
    preparing a substrate on which a toner image of a toner, in which a volume fraction of particles having a particle diameter of 16 µm or more is less than 1%, is formed; and
    forming a foil image on the toner image of the substrate,
    wherein the toner image is a plastic toner image having plasticity, which is formed by a plastic toner,
    in the forming, a foil is pressed against the substrate at a temperature of 70 or lower, to form the foil image on the plastic toner image of the substrate, and
    the plastic toner satisfies Expression (1):

$$20° C. \leq T(1 \text{ MPa}) - T(10 \text{ MPa}) \tag{1}$$

wherein, in expression (1), T (1 MPa), represents a temperature at which a viscosity of the plastic toner becomes $10^4$ Pa·s under an applied pressure of 1 MPa, and T (10 MPa) represents a temperature at which a viscosity of the plastic toner becomes $10^4$ Pa·s under an applied pressure of 10 MPa.

10. The method of producing a wiring substrate according to claim 9, wherein the plastic toner is a pressure-sensitive toner whose viscosity is lowered when the foil is pressed at the temperature of 70° C. or lower.

11. The method of producing a wiring substrate according to claim 10,
wherein the pressure-sensitive toner includes a first resin and a second resin, which have different glass transition temperatures, and
the first resin and the second resin are present with phase separation.

12. The method of producing a wiring substrate according to claim 11,
wherein the pressure-sensitive toner has a core-shell structure including a core in which the first resin and the second resin are present with phase separation, and a shell coating the core.

13. The method of producing a wiring substrate according to claim 12,
wherein the first resin has a glass transition temperature higher than the second resin, and
a total amount of the first resin in the shell is greater than a total amount of the second resin in the shell, in terms of parts by weight.

14. The method of producing a wiring substrate according to claim 9,
wherein, in the forming, the foil is pressed against a region larger than a region where the toner image is formed in the substrate, to form the foil image on the toner image of the formed member.

15. The method of producing a wiring substrate according to claim 14,
wherein, in the forming, an integrally formed film-shaped foil is pressed against the substrate, to form the foil image on the toner image of the substrate.

16. The method of producing a wiring substrate according to claim 14,
wherein, in the forming, a foil holding unit which holds plural powdery foils is pressed against the substrate, to form the foil image on the toner image of the substrate.

17. A method of producing an integrated circuit, comprising:
preparing the wiring substrate according to claim 9; and
attaching a semiconductor element to the wiring substrate.

* * * * *